US00RE49066E

(19) United States
(12) Reissued Patent
Lafarre et al.

(10) Patent Number: US RE49,066 E
(45) Date of Reissued Patent: May 10, 2022

(54) CHUCKS AND CLAMPS FOR HOLDING OBJECTS OF A LITHOGRAPHIC APPARATUS AND METHODS FOR CONTROLLING A TEMPERATURE OF AN OBJECT HELD BY A CLAMP OF A LITHOGRAPHIC APPARATUS

(71) Applicants: ASML Holding N.V., Veldhoven (NL); ASML Netherlands B.V., Veldhoven (NL)

(72) Inventors: Raymond Wilhelmus Louis Lafarre, Helmond (NL); Adrianus Hendrik Koevoets, Mierlo (NL); Michael Leo Nelson, Redding, CT (US); Jacobus Cornelis Gerardus Van Der Sanden, Geldrop (NL); Geoffrey O'Connor, Easton, CT (US); Michael Andrew Chieda, Easton, CT (US); Tammo Uitterdijk, Wilton, CT (US)

(73) Assignees: ASML Holding N.V., Veldhoven (NL); ASML Netherlands B.V., Veldhoven (NL)

(21) Appl. No.: 16/804,549

(22) Filed: Feb. 28, 2020

Related U.S. Patent Documents

Reissue of:
(64) Patent No.: 10,324,383
Issued: Jun. 18, 2019
Appl. No.: 15/764,594
PCT Filed: Oct. 5, 2016
PCT No.: PCT/EP2016/073704
§ 371 (c)(1),
(2) Date: Mar. 29, 2018
PCT Pub. No.: WO2017/060259
PCT Pub. Date: Apr. 13, 2017

U.S. Applications:
(60) Provisional application No. 62/271,688, filed on Dec. 28, 2015, provisional application No. 62/237,732, filed on Oct. 6, 2015.

(51) Int. Cl.
*G03F 7/20* (2006.01)
*H01L 21/683* (2006.01)
*H01L 21/67* (2006.01)

(52) U.S. Cl.
CPC ..... *G03F 7/70875* (2013.01); *G03F 7/707* (2013.01); *G03F 7/70783* (2013.01);
(Continued)

(58) Field of Classification Search
CPC .. G03F 7/707; G03F 7/70875; G03F 7/70783; H01L 21/6831; H01L 21/67115; H01L 21/67109; H01L 21/67248
See application file for complete search history.

(56) References Cited

U.S. PATENT DOCUMENTS 5,063,582 A 11/1991 Mori et al.
5,738,165 A 4/1998 Imai
(Continued)

FOREIGN PATENT DOCUMENTS

CN 1529994 A 9/2004
CN 102981370 A 3/2013
(Continued)

OTHER PUBLICATIONS

"Room temperature." The American Heritage(R) Dictionary of the English Language, edited by Editors of the American Heritage Dictionaries, Houghton Mifflin, 6th edition, 2016. (Year: 2016).*
(Continued)

*Primary Examiner* — Christina Y. Leung
(74) *Attorney, Agent, or Firm* — Sterne, Kessler, Goldstein & Fox P.L.L.C.

(57) ABSTRACT

A lithographic apparatus includes a clamp (406) configured to receive an object (402). The clamp defines at least one channel (408) configured to pass a fluid at a first fluid temperature. The lithographic apparatus also includes a
(Continued)

chuck (404) coupled to the clamp. The chuck (404) defines at least one void (464) configured to thermally insulate the chuck from the clamp.

46 Claims, 15 Drawing Sheets

(52) U.S. Cl.
CPC .... *H01L 21/6831* (2013.01); *H01L 21/67109* (2013.01); *H01L 21/67115* (2013.01); *H01L 21/67248* (2013.01)

(56) References Cited

U.S. PATENT DOCUMENTS

| | | | | |
|---|---|---|---|---|
| 6,555,936 | B1 | 4/2003 | Tanaka et al. | |
| 7,212,273 | B2 | 5/2007 | Terashima | |
| 7,274,004 | B2 | 9/2007 | Benjamin et al. | |
| 7,528,930 | B2 | 5/2009 | Tokita | |
| 7,719,659 | B2 | 5/2010 | Kawakami | |
| 8,168,017 | B2 | 5/2012 | Lipson et al. | |
| 8,546,283 | B2 | 10/2013 | Miyasaka et al. | |
| 9,507,275 | B2 | 11/2016 | Lafarre et al. | |
| 9,897,928 | B2 | 2/2018 | Kunnen et al. | |
| 10,324,383 | B2 | 6/2019 | Lafarre et al. | |
| 2005/0211694 | A1 | 9/2005 | Moroz | |
| 2006/0274298 | A1 | 12/2006 | Akaike | |
| 2007/0029740 | A1 | 2/2007 | Natsuhara et al. | |
| 2008/0017104 | A1* | 1/2008 | Matyushkin | H05B 3/0047 118/696 |
| 2008/0023926 | A1 | 1/2008 | Kim | |
| 2008/0121821 | A1 | 5/2008 | Muka et al. | |
| 2008/0144251 | A1* | 6/2008 | Tao | H01L 21/6833 361/234 |
| 2009/0159590 | A1 | 6/2009 | Yonekura et al. | |
| 2009/0207392 | A1* | 8/2009 | Rijpma | G03B 27/52 355/30 |
| 2011/0116068 | A1* | 5/2011 | Wilklow | G03F 1/24 355/67 |
| 2012/0026474 | A1* | 2/2012 | Nayfeh | G03F 7/70875 355/30 |
| 2013/0045447 | A1* | 2/2013 | Kunnen | G03F 7/70875 430/322 |
| 2014/0034608 | A1* | 2/2014 | Benjamin | H01L 21/67103 216/59 |
| 2014/0253900 | A1* | 9/2014 | Cornelissen | G03F 7/70708 355/72 |
| 2015/0228514 | A1 | 8/2015 | Lee et al. | |
| 2015/0370180 | A1 | 12/2015 | Del Puerto et al. | |
| 2018/0321602 | A1 | 11/2018 | Lafarre et al. | |

FOREIGN PATENT DOCUMENTS

| | | | | |
|---|---|---|---|---|
| CN | 104176699 | A | 12/2014 | |
| JP | H06-037172 | A | 2/1994 | |
| JP | H07-106244 | A | 4/1995 | |
| JP | H11-135407 | A | 5/1999 | |
| JP | 2003-282685 | A | 10/2003 | |
| JP | 2005-197447 | A | 7/2005 | |
| JP | 2005-276886 | A | 10/2005 | |
| JP | 2005-353982 | A | 12/2005 | |
| JP | 2007-043042 | A | 2/2007 | |
| JP | 2007-142238 | A | 6/2007 | |
| JP | 2007-235171 | A | 9/2007 | |
| JP | 2009-152475 | A | 7/2009 | |
| JP | 2010-114397 | A | 5/2010 | |
| JP | 2011-151386 | A | 8/2011 | |
| JP | 2013-251311 | A | 12/2013 | |
| JP | 2015-035448 | A | 2/2015 | |
| JP | 2015-519755 | A | 7/2015 | |
| TW | 200836290 | A | 9/2008 | |
| WO | WO 2008/124555 | A1 | 10/2008 | |
| WO | WO 2014/093306 | | 6/2014 | |
| WO | WO-2014122151 | A2 * | 8/2014 | G03F 7/70975 |
| WO | WO 2016/030069 | A1 | 3/2016 | |

OTHER PUBLICATIONS

Non-Final Office Action directed to U.S. Appl. No. 15/764,594, dated Oct. 10, 2018; 7 pages.
Notice of Allowance directed to U.S. Appl. No. 15/764,594, dated Feb. 5, 2019; 5 pages.
International Search Report and Written Opinion of the International Searching Authority directed to related International Patent Application No. PCT/EP2016/073704, dated Jan. 5, 2017; 12 pages.
International Preliminary Report on Patentability directed to related International Patent Application No. PCT/EP2016/073704, dated Apr. 10, 2018; 8 pages.

* cited by examiner

CHUCKS AND CLAMPS FOR HOLDING OBJECTS OF A LITHOGRAPHIC APPARATUS AND METHODS FOR CONTROLLING A TEMPERATURE OF AN OBJECT HELD BY A CLAMP OF A LITHOGRAPHIC APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims priority of U.S. Provisional Patent Application No. 62/237,732, filed on Oct. 6, 2016, and U.S. Provisional Patent Application No. 62/271,688, filed on Dec. 28, 2016, both of which are incorporated herein in their entirety by reference.

FIELD

The present disclosure relates to chucks and clamps for holding objects of a lithographic apparatus and methods for controlling a temperature of an object held by a clamp of a lithographic apparatus.

BACKGROUND

A lithographic apparatus exposes a desired pattern onto a target portion of a substrate. Lithographic apparatuses can be used, for example, to manufacture integrated circuits (ICs). In that circumstance, a patterning device, for example, a mask or a reticle, can be used to generate a circuit pattern corresponding to an individual layer of the IC, and this pattern can be imaged onto a target portion (for example, part of one or several dies) on a substrate (for example, a silicon wafer) that has a layer of radiation-sensitive material (resist). Typically, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA, or by decreasing the value of $k_1$.

To shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

The radiation generated by such sources will not, however, be only EUV radiation and the source may also emit at other wavelengths including infra-red (IR) radiation and deep ultra-violet (DUV) radiation. DUV radiation can be detrimental to the lithography system as it can result in a loss of contrast. Furthermore unwanted IR radiation can cause heat damage to components within the system. It is therefore known to use a spectral purity filter to increase the proportion of EUV in the transmitted radiation and to reduce or even eliminate unwanted non-EUV radiation such as DUV and IR radiation.

A lithographic apparatus using EUV radiation may require that the EUV radiation beam path, or at least substantial parts of it, must be kept in vacuum during a lithographic operation. In such vacuum regions of the lithographic apparatus, a clamp may be used to clamp an object, such as a patterning device and/or a substrate, to a structure of the lithographic apparatus, such as a chuck of a patterning device table and/or a substrate table, respectively.

In addition, a lithographic apparatus using EUV radiation may require temperature regulation of, for example, the patterning device and/or the substrate. Heat produced by the EUV radiation or the unwanted non-EUV radiation may cause deformations in, for example, the patterning device and/or the substrate during a lithographic operation because of the heat absorbed by the patterning device and/or the substrate. To reduce the deformation, a cooling fluid may be circulated through the clamp.

BRIEF SUMMARY

In some embodiments, a lithographic apparatus includes a clamp configured to receive an object. The clamp defines at least one channel configured to pass a fluid at a first fluid temperature. The lithographic apparatus also includes a chuck coupled to the clamp. The chuck defines at least one void configured to thermally insulate the chuck from the clamp.

In some embodiments, the at least one void is at a vacuum. In other embodiments, the at least one void is filled with a fluid.

In some embodiments, the at least one void includes a plurality of voids. In some embodiments, the chuck includes a plurality of burls defining the at least one void. The chuck can include a first layer coupled to the clamp and a second layer defining the plurality of burls that define the at least one void.

In some embodiments, the lithographic apparatus includes a fluid conditioning device configured to change a temperature of the first fluid. The fluid conditioning device can be configured to change a temperature of the first fluid from a second fluid temperature to the first fluid temperature. The fluid conditioning device can be configured to change the temperature of the first fluid from the second fluid temperature to the first fluid temperature when the object is being exposed with radiation, and the second fluid temperature is greater than the first fluid temperature. In some embodiments, the first fluid temperature is in a range from about −15° C. to about 15° C., and the second fluid temperature is in a range from about 17° C. to about 27° C. In some embodiments, the first fluid temperature is less than a target average temperature of the object when the object is being exposed with radiation.

In some embodiments, the object comprises a material having a coefficient of thermal expansion that varies as a function of temperature, and the coefficient of thermal expansion of the material of the object is about zero at a zero-crossing temperature of the object. The first fluid temperature can be such that an average temperature of the object when the object is being exposed with radiation is equal to about the zero-crossing temperature of the object. The first fluid temperature can also be such that internal forces of the object when the object is being exposed with radiation are substantially symmetric in a direction perpendicular to a surface of the clamp holding the object. The first fluid temperature can also be such that a sum of the internal forces of the object when the object is being exposed with radiation is about equal to zero.

In some embodiments, the at least one channel comprises a plurality of channels, and the object is a patterning device.

In some embodiments, a method for controlling a temperature of an object held by a clamp of a lithographic apparatus includes exposing an object with radiation. The method also includes passing a fluid at a first fluid temperature through at least one channel defined by the clamp to condition a temperature of the clamp. The clamp is coupled to a chuck defining at least one void configured to thermally insulate the chuck from the clamp.

In some embodiments, the method also includes, before passing the fluid at the first fluid temperature through the at least one channel defined by the clamp, passing the fluid at a second fluid temperature through the at least one channel defined by the clamp to condition the temperature of the clamp. The method also includes, after passing the fluid at the second fluid temperature through the at least one channel defined by the clamp, changing the second fluid temperature of the fluid to the first fluid temperature of the fluid. The second fluid temperature is greater than the first fluid temperature.

In some embodiments, the first fluid temperature is conditioned to be in a range from about −15° C. to about 15° C., and the second fluid temperature is conditioned to be in a range from about 17° C. to about 27° C. In some embodiments, the first fluid temperature is conditioned to be about −8° C., and the second fluid temperature is conditioned to be about 22° C. In some embodiments, the first fluid temperature is conditioned to be less than an average temperature of the object when exposing the object with radiation.

In some embodiments, the object comprises a material having a coefficient of thermal expansion that varies as a function of temperature, and the coefficient of thermal expansion of the material of the object is about zero at a zero-crossing temperature. And the passing the fluid at the first fluid temperature through the at least one channel generates an average temperature of the object when exposing the object with radiation that is equal to about the zero-crossing temperature of the material of the object.

In some embodiments, the first fluid temperature is such that internal forces of the object when the object is being exposed with radiation are substantially symmetric in a direction perpendicular to a surface of the clamp holding the object. In some embodiments, the first fluid temperature is such that a sum of the internal forces of the object when the object is being exposed with radiation is about equal to zero. In some embodiments, the object is a patterning device.

Further features and advantages of the embodiments, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the embodiments and to enable a person skilled in the relevant art(s) to make and use the invention.

Figure 7:
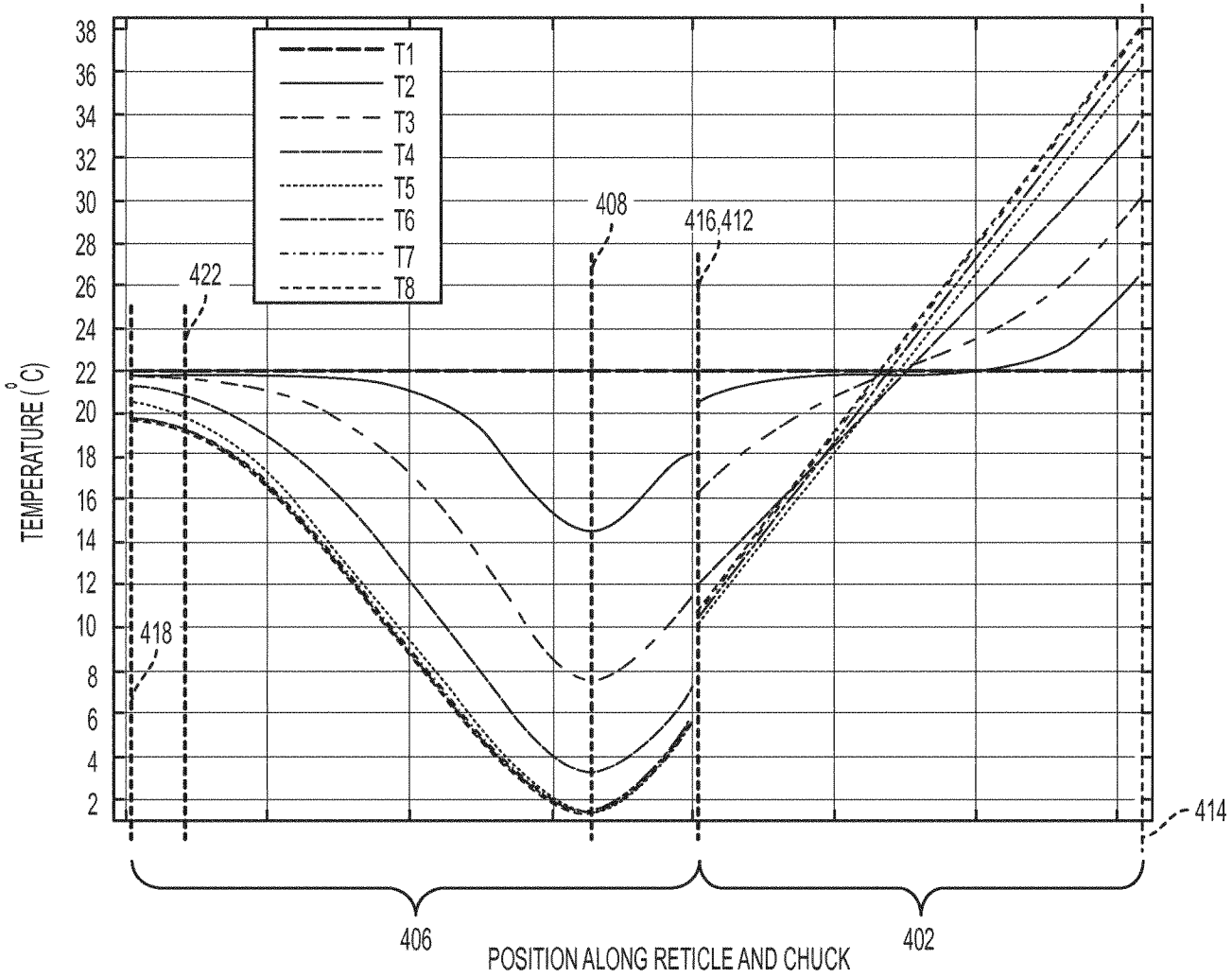

FIG. 7 charts the temperature of an object and the clamp along a direction perpendicular to the exposure surface of the object at various points in time, according to an embodiment.

Figure 5:
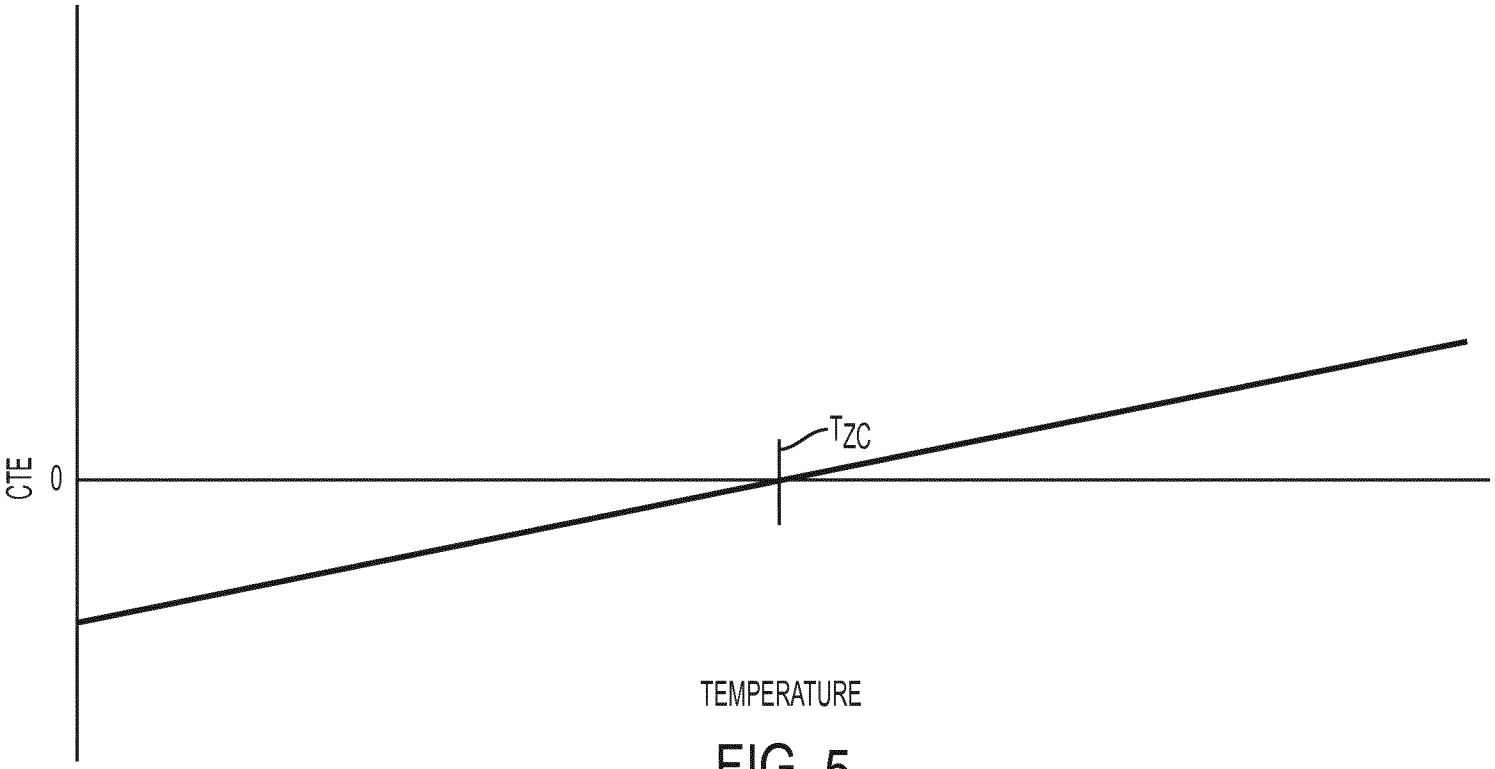
FIG. 5 illustrates a diagram charting the coefficient of thermal expansion of a material that varies as a function of temperature, according to an embodiment.
Figure 8:
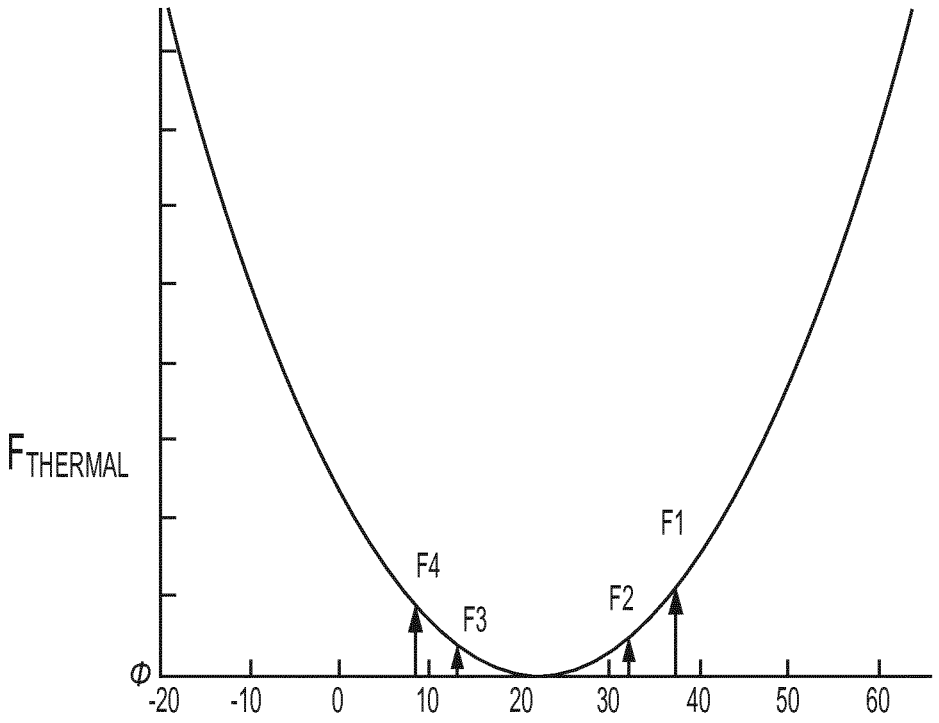

FIG. 8 illustrates a diagram illustrating the generated internal forces of an object comprising a material having a temperature-dependent coefficient of thermal expansion as shown in FIG. 5 and a temperature distribution as shown in FIG. 7, according to an embodiment.

Figure 3:
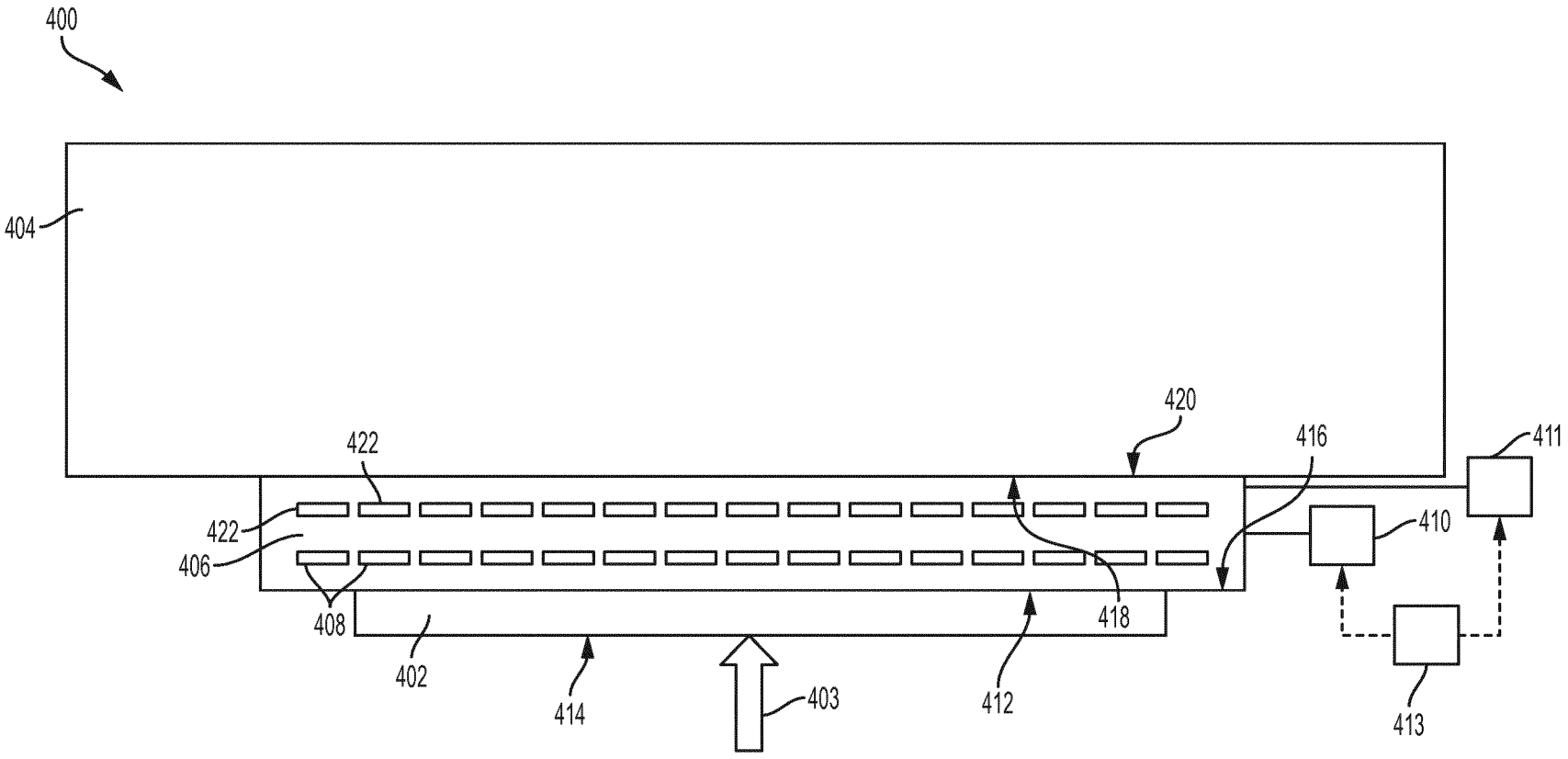
FIG. 3 is a schematic illustration of a cross-sectional view of a chuck and a clamp holding an object, according to an embodiment.
Figure 9:
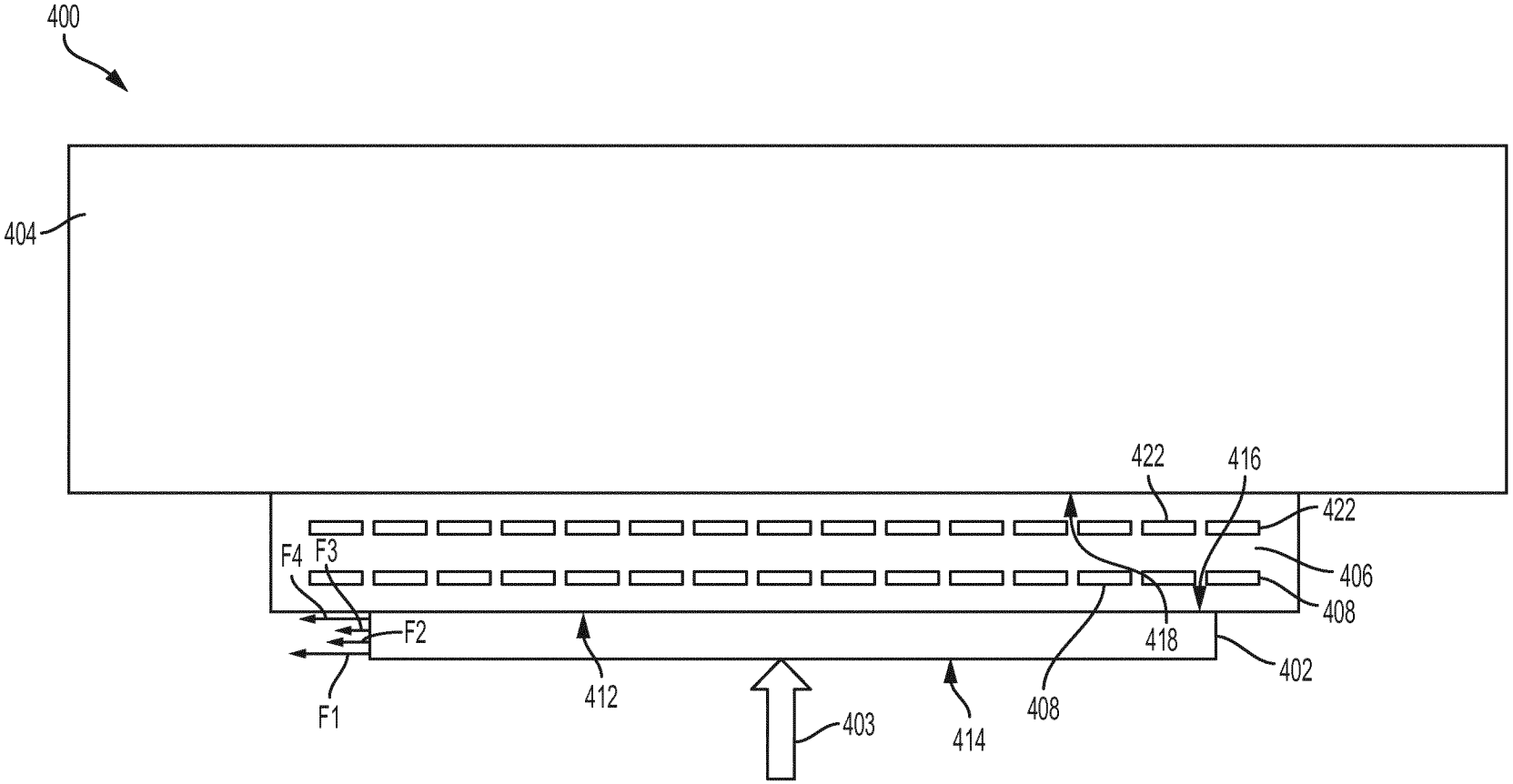

FIG. 9 is a cross-sectional view of the chuck and the clamp holding the object of FIG. 3, schematically showing the generated internal forces generated by a temperature distribution as shown in FIG. 8, according to another embodiment.

Figure 10:
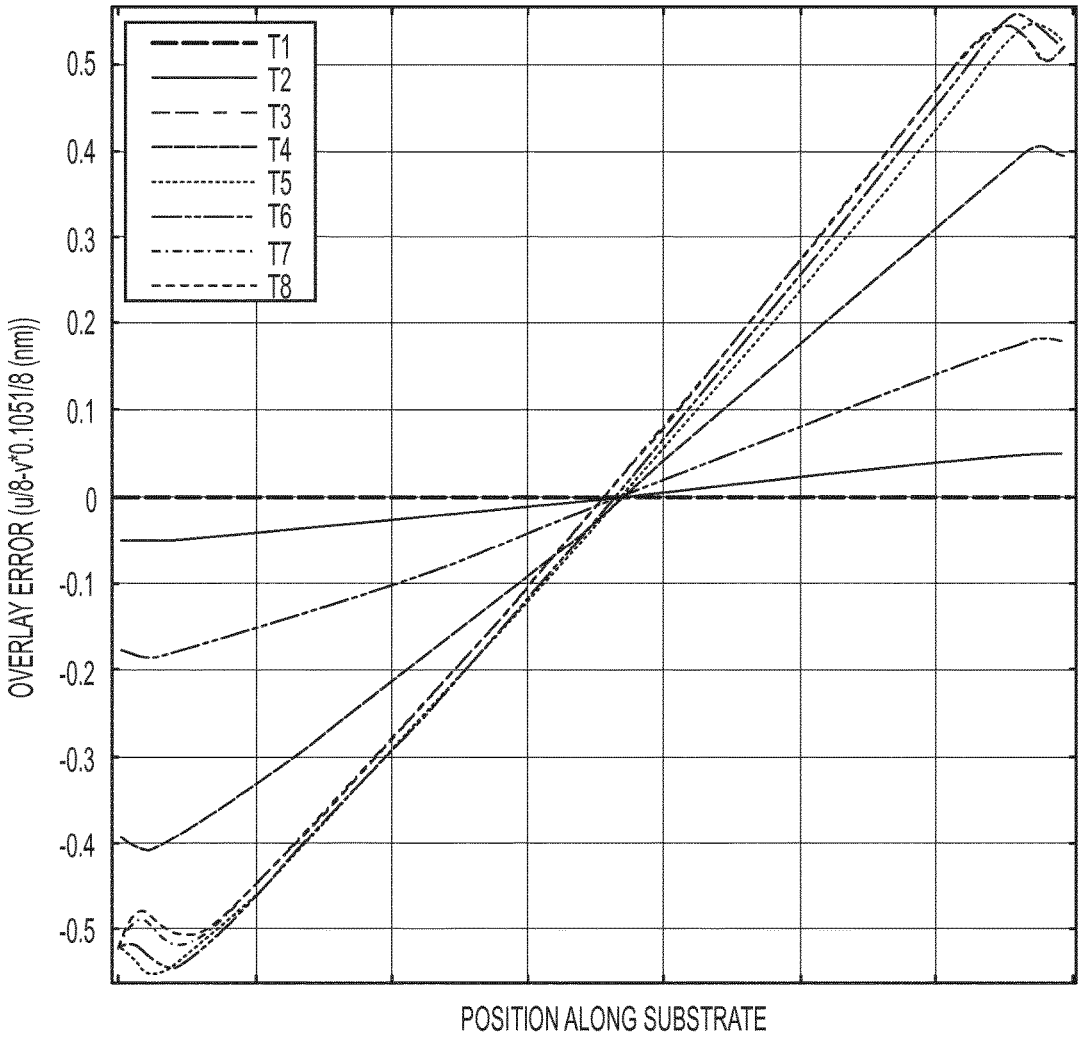

FIG. 10 charts the raw overlay error of a pattern exposed on a substrate at various points in time, according to an embodiment.

Figure 11:
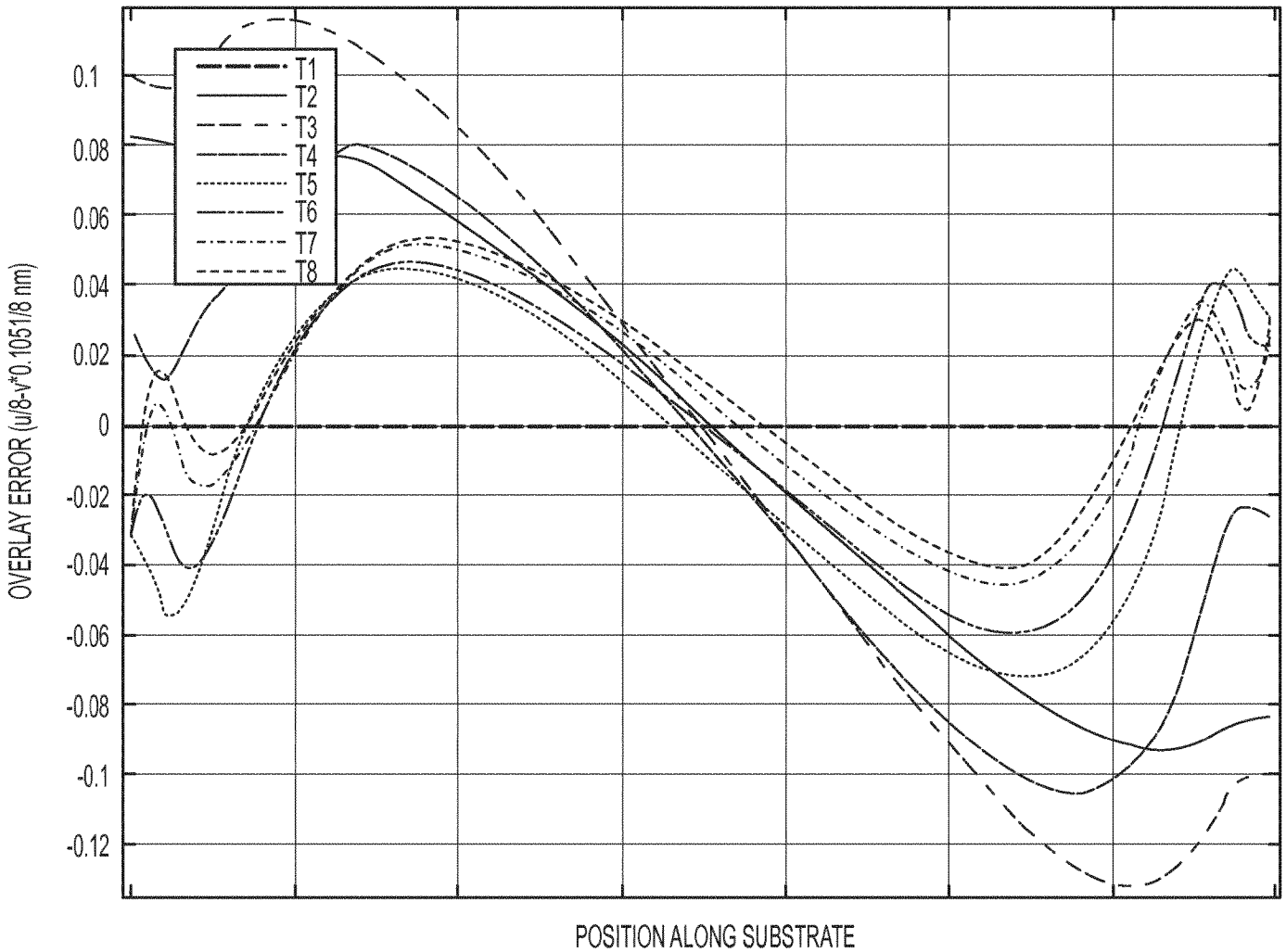

FIG. 11 charts the raw overlay error of a pattern exposed on a substrate at various points in time, according to another embodiment.

Figure 12:
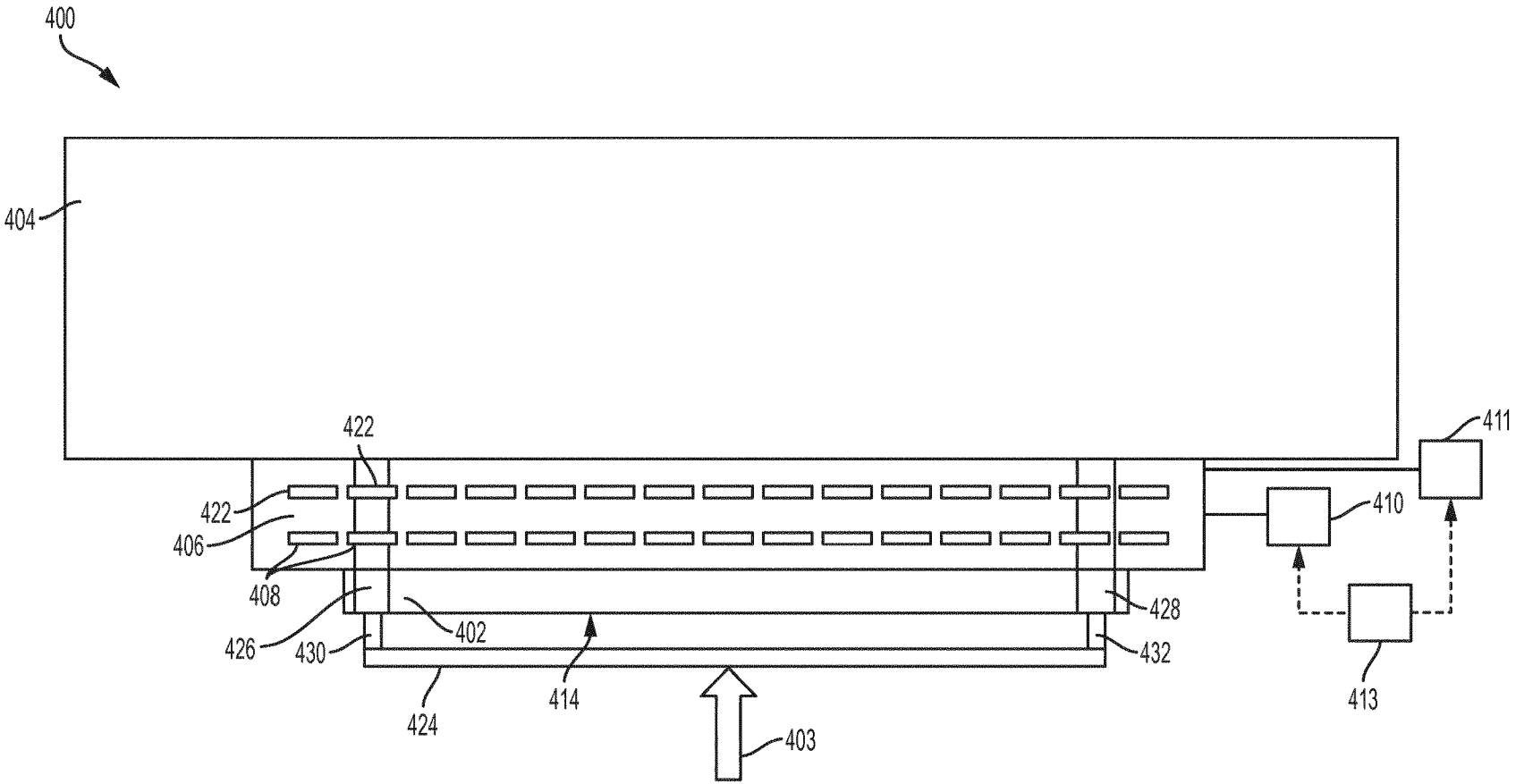

FIG. 12 is a schematic illustration of a cross-sectional view of the chuck and the clamp holding the object of FIG. 3 with a pellicle, according to an embodiment.

Figure 13:
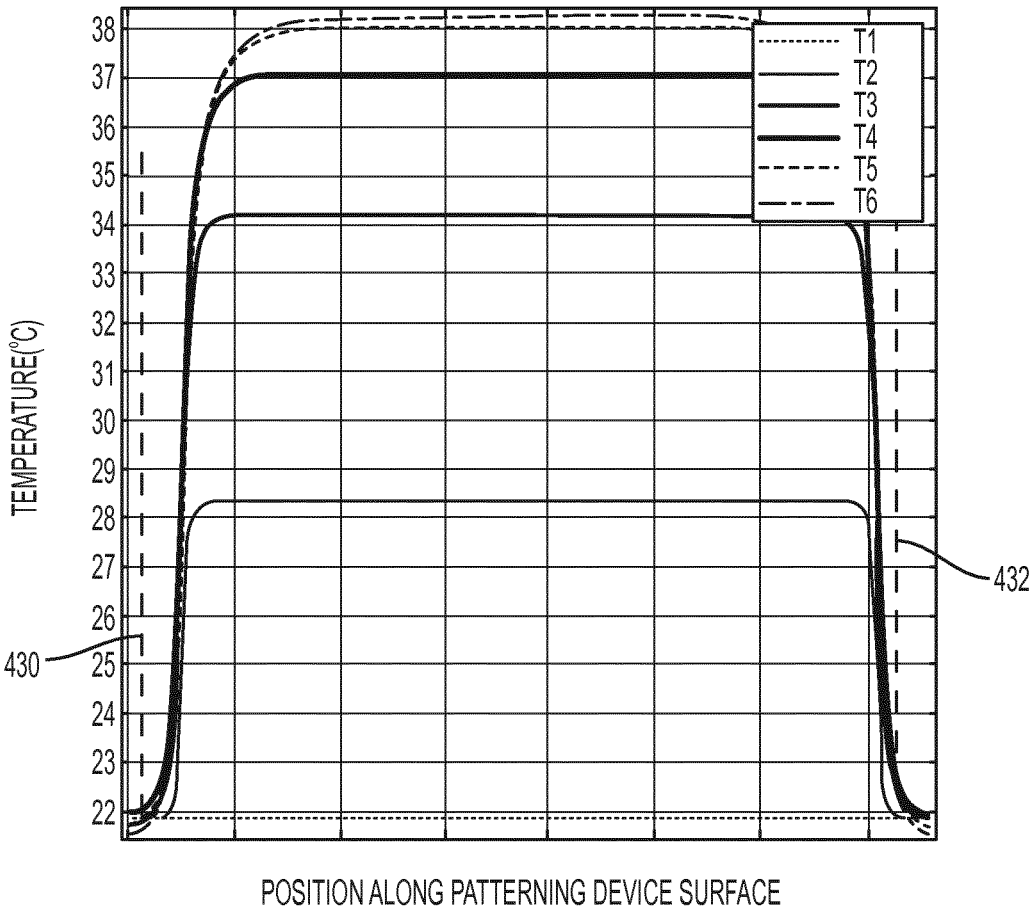

FIG. 13 charts the temperature of a surface of the object in FIG. 12 exposed to radiation at various points in time, according to an embodiment.

Figure 14:
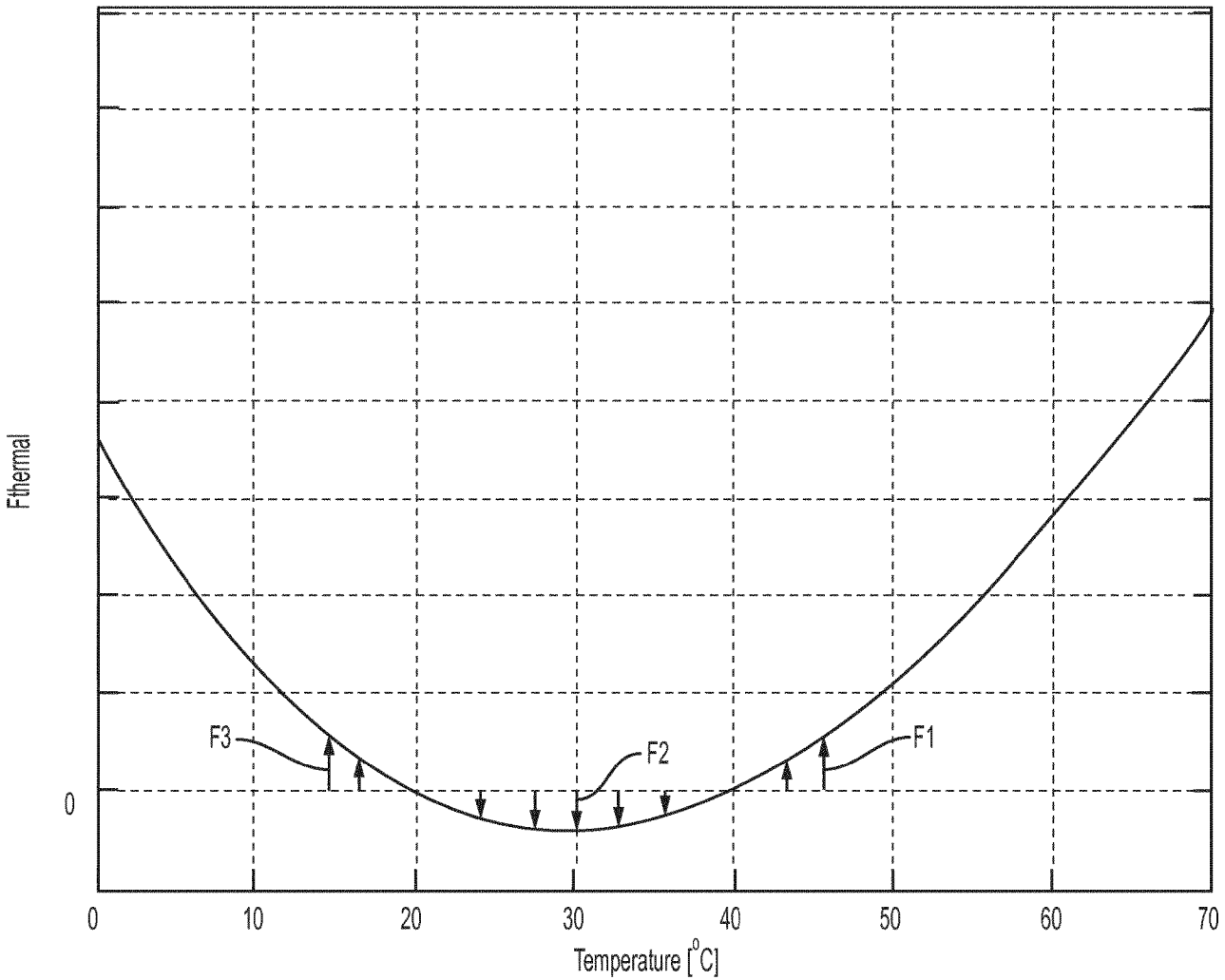

FIG. 14 illustrates a diagram illustrating the generated internal thermal forces of an object comprising a material having a temperature-dependent coefficient of thermal expansion and a zero-crossing temperature greater than the temperature of the object at an undeformed state, according to an embodiment.

Figure 15:
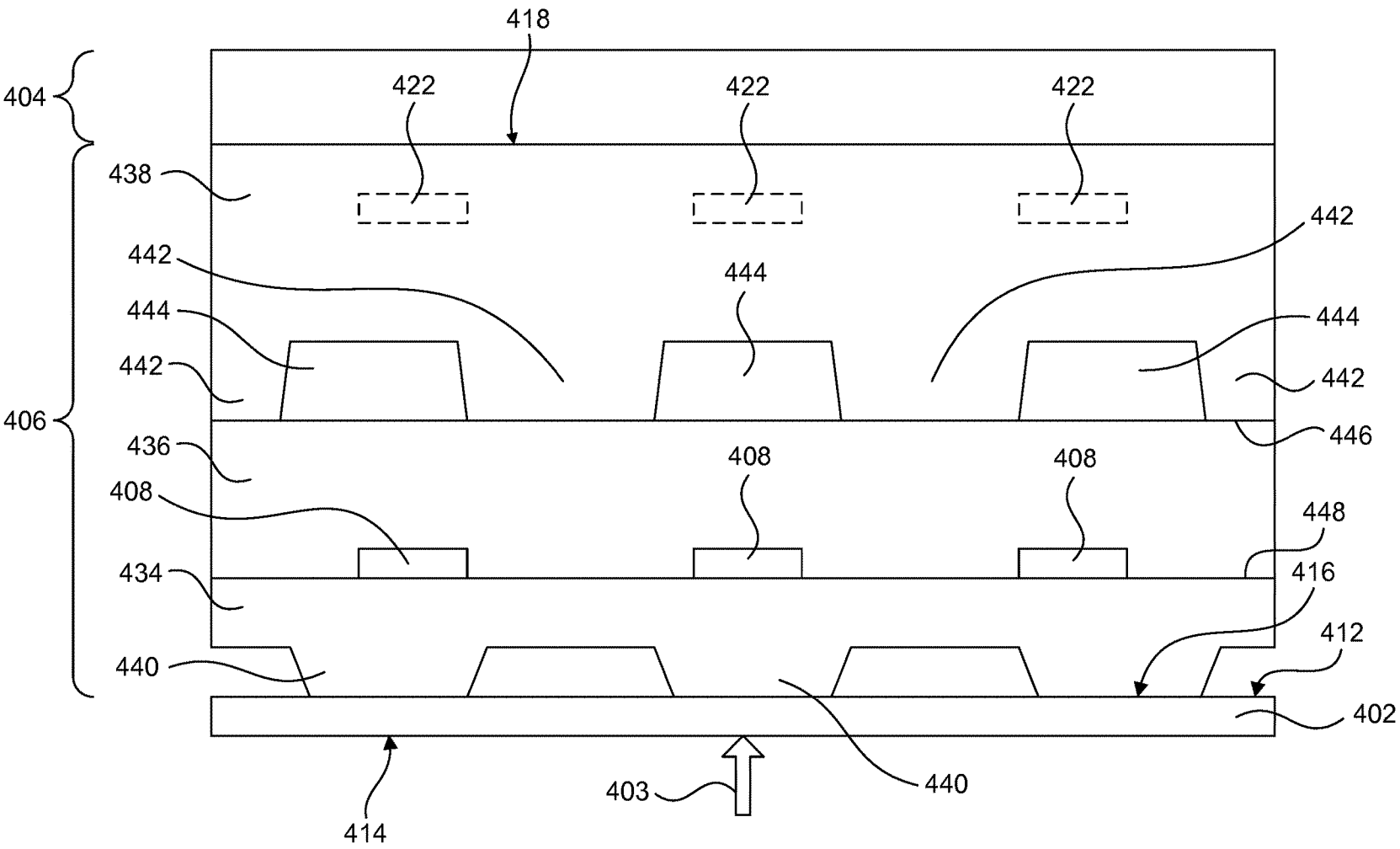

FIG. 15 is a schematic illustration of a cross-sectional view of a clamp holding an object, according to an embodiment.

Figure 16:
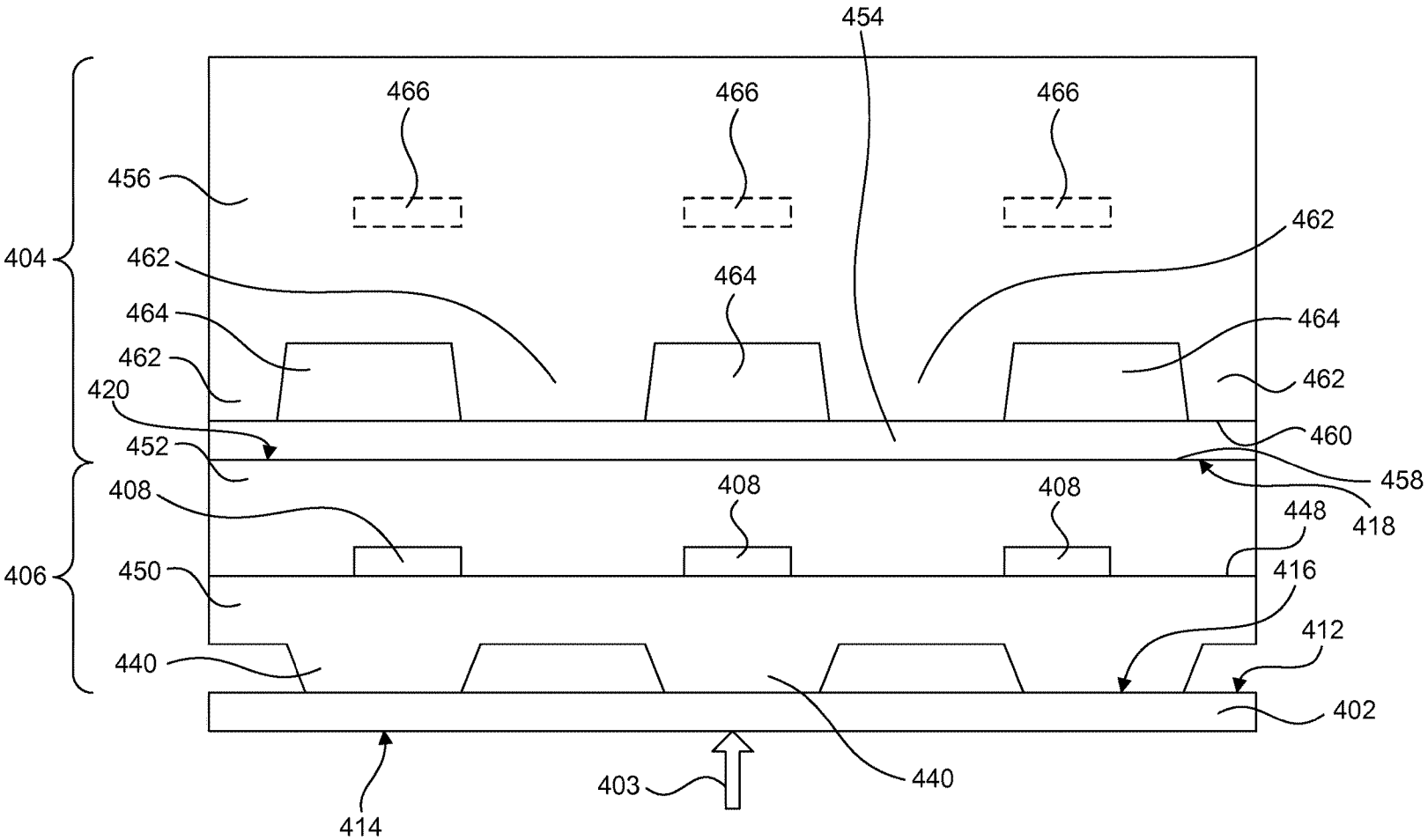

FIG. 16 is a schematic illustration of a cross-sectional view of a chuck and clamp holding an object, according to another embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "some embodiments," "other embodiments," "an example embodiment," "for example," "exemplary," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Exemplary Reflective Lithographic System

Figure 1:
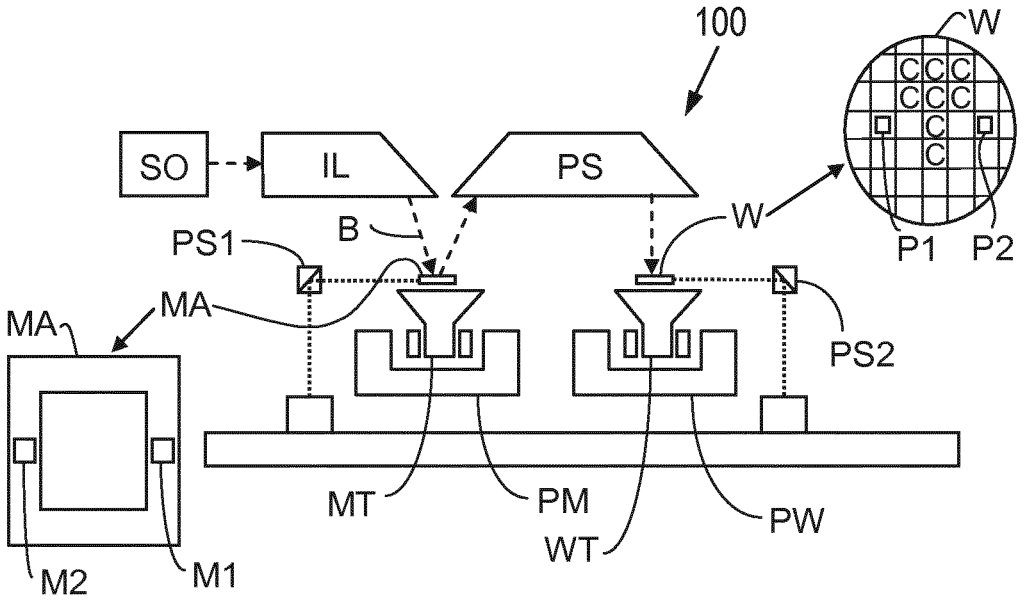
FIG. 1 is a schematic illustration of a reflective lithographic apparatus, according to an embodiment.

FIG. 1 schematically shows a lithographic apparatus 100 including a source collector module SO according to an embodiment. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be reflective (as in lithographic apparatus 100 of FIG. 1) or transmissive. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of a EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporize a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-) magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
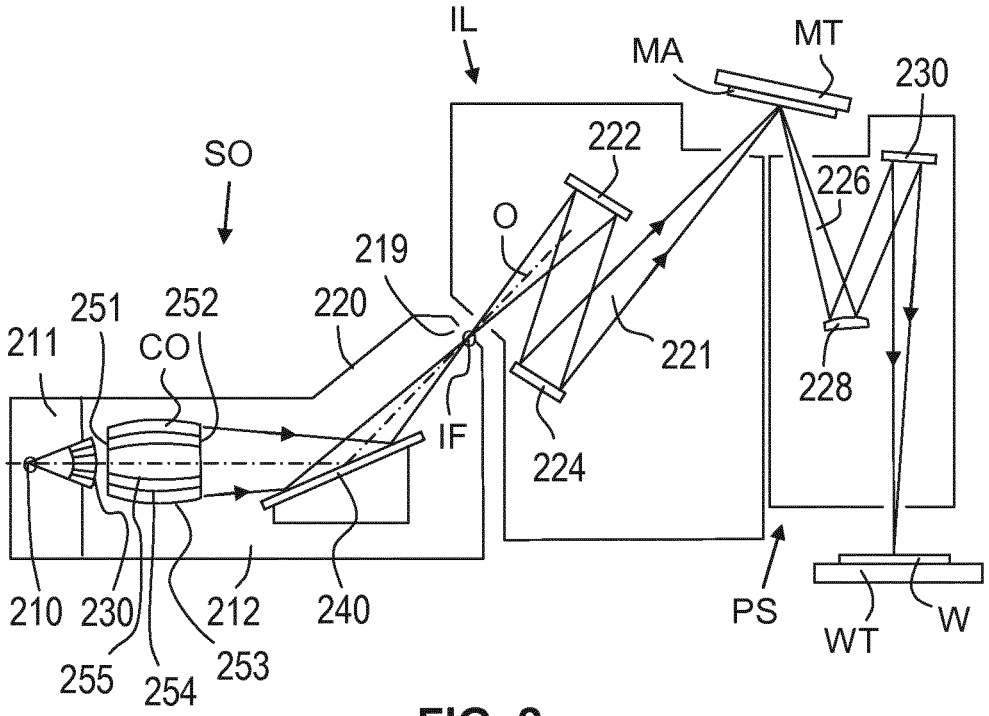
FIG. 2 is a schematic illustration of a reflective lithographic apparatus, according to another embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. A EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Exemplary Embodiments of an Object Support

In some embodiments, a support of a lithographic apparatus is configured to hold an object and control the temperature of the object. The support can be a substrate table WT configured to hold substrate W or a support structure MT configured to hold patterning device MA as described above in FIGS. 1 and 2. The object can be, for example, a patterning device such as a mask or reticle as described above, or the object can be, for example, a substrate such as a wafer as described above. In some embodiments in which the object is a patterning device, patterning device imparts a pattern onto a beam of radiation incident on a surface of patterning device. When the object is clamped to the clamp, a surface of the object receives a radiation beam. When the object is exposed with an incident radiation beam, the object can absorb power from the radiation beam and heat up. When the object is heated, portions of the object can expand and deform. In some embodiments, to prevent or reduce deformation of object, the support can be configured to condition the object to be held at substantially room temperature (for example, about 22° C.) or any other defined operating temperature, according to various embodiments. The clamp is configured to act as a heat sink, and the clamp can be configured to be maintained at a temperature lower than the target average temperature of the object to accomplish this temperature control of the object. In some embodiments, the clamp is maintained at a temperature lower than the target temperature of object by passing a fluid conditioned to a target temperature through at least one channel defined by clamp. But over time, the cooling power of fluid passing through the at least one channel will also cool the chuck, causing deformation of the chuck which in turn leads to deformation of the clamp and the object. In an embodiment in which the object is a patterning device having a reflective surface, portions of the reflective surface can be deformed, causing unwanted image distortion at the substrate wafer. Additionally, deformation of the object can cause slip between the chuck and the object. Moreover, chuck deformations, by itself, can also lead to changes in the chuck metrology leading to chuck positioning errors and, consequently, image overlay errors at the substrate wafer.

To eliminate or reduce this deformation of the clamped object as well as chuck positioning errors due to deformation of the chuck, a support configured to hold an object of a lithographic apparatus can include a clamp with both (1) at least one channel configured to pass a fluid to condition a chuck at target temperature and (2) at least one separate channel configured to pass a fluid to condition the object at target temperatures in an embodiment. FIG. 3 shows a cross-sectional diagram of a portion of a lithographic apparatus according to one such embodiment.

FIG. 3 illustrates a support 400 configured to hold and control the temperature of an object 402 and control the temperature of object 402 and of chuck 404. Support 400 can be a substrate table WT configured to hold a substrate W or can be a support structure MT configured to hold a patterning device MA as described above in FIGS. 1 and 2. Accordingly, object 402 can be, for example, patterning device MA such as a mask or reticle as described above, or object 402 can be, for example, a substrate W such as a wafer as described above. In some embodiments in which object 402 is a patterning device, patterning device 402 imparts a pattern onto an incident beam of radiation 403.

In some embodiments, support 400 includes a chuck 404 and a clamp 406 coupled to chuck 404. For example, clamp 406 can be bonded to chuck 404. Clamp 406 is configured to selectively couple object 402 to chuck 404 such that object 402 moves along with chuck 404. In some embodiments, clamp 406 is an electrostatic clamp. For example, clamp 406 can be configured to generate an electrostatic field to hold object 402 in place. In such electrostatic embodiments, clamp 406 can include electrodes (not shown) that generate this electrostatic field.

Clamp 406 defines a mounting surface 416 configured to receive object 402 (e.g., a substrate W or a patterning device MA). In some embodiments, mounting surface 416 is planar as shown in FIG. 3. In other embodiments (not shown), mounting surface 416 is non-planar. For example, mounting surface 416 can have protruding burls configured to contact object 402 during clamping operation of clamp 406.

In some embodiments, clamp 406 is made of a single layer as shown in FIG. 3. In other embodiments (not shown), clamp 406 can be made of a plurality of layers.

In some embodiments, clamp 406 is composed of one or more dielectric materials configured to support an electrostatic field during operation of clamp 406 as described above. In some embodiments, the dielectric materials can have ultra-low coefficients of thermal expansion that are zero or substantially zero. Materials having ultra-low coefficients of thermal expansion include, but not limited to, ultra-low expansion silicon-based materials (e.g., ULE® glass manufactured by Corning), glass materials, ceramic materials, silicon-based glass ceramic materials (e.g., ZERODUR® glass ceramic manufactured by SCHOTT), or a combination thereof. Using materials that have ultra-low coefficients of thermal expansion can help reduce thermal stress in clamp 406 which may be transferred to object 402 during clamping operation.

Figure 6:
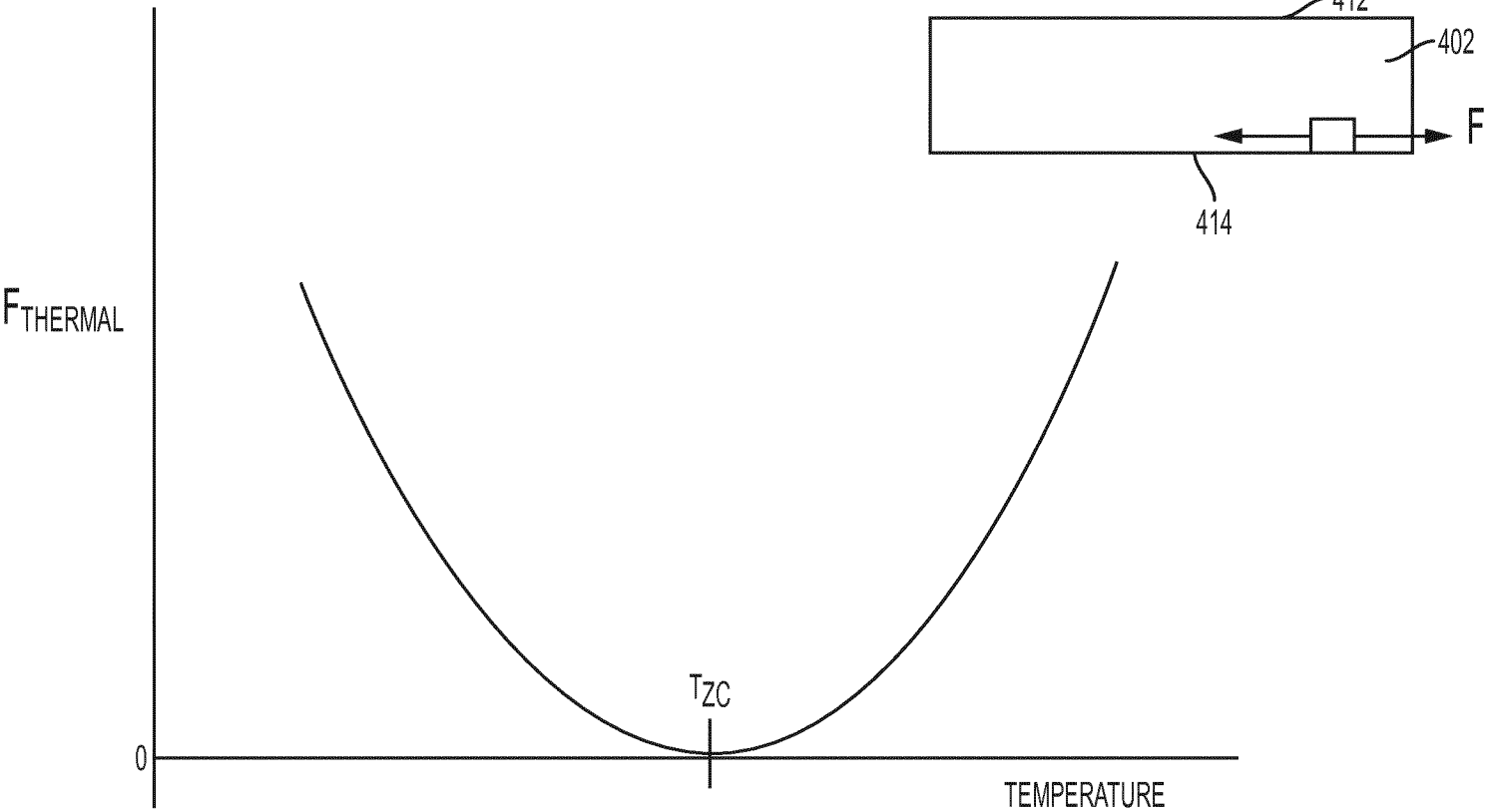
FIG. 6 illustrates a diagram charting the generated internal forces of an object comprising a material with a temperature-dependent coefficient of thermal expansion (as shown in FIG. 5) as a function of temperature, according to an embodiment.

In some embodiments, clamp 406 is composed of one or more materials having ultra-low coefficients of thermal expansion that vary as a function of temperature. FIG. 5 charts the coefficient of thermal expansion of one such material as a function of temperature according to an embodiment. Referencing FIG. 5, the temperature at which the coefficient of thermal expansion is about zero is called the zero-crossing temperature $T_{zc}$. If this function is substantially linear as shown in FIG. 5, the internal forces generated within clamp 406 will be a second order polynomial function of temperature as shown in FIG. 6, which illustrates an exemplary diagram of internal thermal forces F of clamp 406 due to expansion of the material as a function of temperature. As shown in FIG. 6, if the temperature of the material is about equal to the zero-crossing temperature $T_{zc}$ of the material, the generated internal thermal forces within clamp 406 are about zero. F=0 is defined with respect to the undeformed state (desired or calibrated shape) of the respective component the material composes, for example, object 402 or clamp 406. In the embodiment of FIG. 6, the temperature of the component, for example, object 402 or clamp 406, at the undeformed state is about equal to the zero-crossing temperature of the material composing the component. As the temperature of the material moves away from the zero-crossing temperature $T_{zc}$, the generated internal forces of clamp 406 increase in a quadratic fashion symmetric about the vertical axis crossing through the zero-crossing temperature $T_{zc}$.

In some embodiments, clamp 406 is composed of a material that has a coefficient of thermal expansion that varies as a function of temperature and that has a zero-crossing temperature deviating substantially from the undeformed temperature of clamp 406 (for example, room temperature or about 22° C.) or any other target operating temperature of the lithographic apparatus. In other embodiments, clamp 406 is composed of a material that has a coefficient of thermal expansion that varies as a function of temperature and that has a zero-crossing temperature less than or more than about room temperature (for example, less than or more than about 22° C.). In some embodiments, clamp 406 is composed of a material that has a coefficient of thermal expansion that varies as a function of temperature and that has a zero-crossing temperature that is less than a zero-crossing temperature of the material composing object 402 (which can also be composed of a material that has a coefficient of thermal expansion that varies as a function of temperature in some embodiments).

Turning back to FIG. 3, clamp 406 has a thickness (i.e., in a direction perpendicular to mounting surface 416) in a range from about 4 mm to about 12 mm in some embodiments. For example, in some embodiments, clamp 406 has a thickness of about 8 mm. In some embodiment, clamp 406 has a thickness greater than a thickness of object 402.

In some embodiments, object 402 is composed of one or more materials having ultra-low coefficients of thermal expansion that are zero or substantially zero. Materials having ultra-low coefficients of thermal expansion include, but not limited to, ultra-low expansion silicon-based materials (e.g., ULE® glass manufactured by Corning), glass materials, ceramic materials, silicon-based glass ceramic materials (e.g., ZERODUR® glass ceramic manufactured by SCHOTT), or a combination thereof.

In some embodiments, object 402 is composed of one or more materials having ultra-low coefficients of thermal expansion that vary as a function of temperature. Again, FIG. 5 charts the coefficient of thermal expansion of one such material as a function of temperature according to an embodiment. Referencing FIG. 5, the temperature at which the coefficient of thermal expansion is about zero is called the zero-crossing temperature $T_{zc}$. If this function is substantially linear as shown in FIG. 5, the internal thermal forces generated within object 402 will vary substantially as a second order polynomial function of temperature as shown in FIG. 6. In some embodiments, object 402 is composed of a material that has a coefficient of thermal expansion that varies as a function of temperature and that has a zero-crossing temperature equal to about room temperature (for example, about 22° C.) or any other target operating temperature of the lithographic apparatus. In other embodiments, object 402 is composed of a material that has a coefficient of thermal expansion that varies as a function of temperature and that has a zero-crossing temperature less than or more than about room temperature (for example, less than or more than about 22° C.). In some embodiments, object 402 is composed of a material that has a coefficient of thermal expansion that varies as a function of temperature and that has a zero-crossing temperature that is more than a zero-crossing temperature of the material composing clamp 406 (which can also be composed of a material that has a coefficient of thermal expansion that varies as a function of temperature in some embodiments as described above). Referencing FIG. 6 in which the temperature of object 402 at the undeformed state is about equal to the zero-crossing temperature of the material composing object 402, if the temperature of a portion of object 402 is about equal to the zero-crossing temperature $T_{zc}$, the generated internal forces within object 402 at that point is about zero. As the temperature of a portion of object 402 moves away from the zero-crossing temperature $T_{zc}$ of the material, the generated internal forces of object 402 increase in a quadratic fashion symmetric about the vertical axis crossing the zero-crossing temperature $T_{zc}$.

In other embodiments, object 402 is composed of a material having ultra-low coefficients of thermal expansion that vary as a function of temperature, and the zero-crossing temperature of the material is greater than the temperature of object 402 at the undeformed state (desired or calibrated shape). For example, the zero-crossing temperature of the material composing object 402 can be about 30° C., and the temperature of object 402 at the undeformed state can be about 20° C. FIG. 14 illustrates the internal forces generated within object 402 due to expansion of the material as a function of temperature according to one such embodiment.

In some embodiments, object 402 is composed of one or more materials having ultra-low coefficients of thermal expansion that vary as a function of temperature, and clamp 406 is composed of one or more materials having ultra-low coefficients of thermal expansion that vary as a function of temperature. In some of these embodiments, the zero-crossing temperature of the one or more materials composing object 402 is higher than the zero-crossing temperature of the one or more materials composing clamp 406. For example, in some embodiments, the zero-crossing temperature of the material(s) composing object 402 is about 22° C., and the zero-crossing temperature of the material(s) composing clamp 406 is about 8° C. In other embodiments, the zero-crossing temperature of the one or more materials composing object 402 is lower than the zero-crossing temperature of the one or more materials composing clamp 406. In yet other embodiments, the zero-crossing temperature of the one or more materials composing object 402 is about equal to the zero-crossing temperature of the one or more materials composing clamp 406.

When object 402 is clamped to clamp 406, a surface 412 of object 402 is adjacent mounting surface 416 of clamp 406, and a surface 414 opposing surface 412 of object 402 faces away from clamp 406 and chuck 404. Surface 414 of object 402 receives radiation beam 403. When object 402 is exposed to incident radiation beam 403, object 402 can absorb power from radiation beam 403 and heat up. For example, radiation beam 403 can deliver a target wattage such that the absorption power at object 402 can be, for example, 3-500 Watts (such as 28 Watts or 80 Watts). In some embodiments, radiation beam 403 is from projection system PS described above and/or other systems of lithographic apparatus 100 during their operation.

To prevent or reduce the deformation of object 402 due to the absorption of heat from radiation beam 403, support 400 can be configured to condition object 402 to be held at substantially room temperature (for example, about 22° C.)

or any other defined operating temperature, and configured to condition chuck 404 to be held at substantially room temperature (for example, about 22° C.) or any other defined operating temperature, according to various embodiments. In some embodiments, clamp 406 is configured to act as a heat sink for object 402. For example, a portion of clamp 406 that receives object 402 can be configured to be maintained at a temperature lower than the target average temperature of object 402 (for example, less than about 22° C.) to accomplish this temperature control of object 402. For example, if the target average temperature of object 402 is about 22° C. (for example, about the zero-crossing temperature of the material composing object 402), a portion of clamp 406 that receives object 402, for example, the portion of clamp 406 having mounting surface 416, can be maintained at a temperature less than about 22° C., for example, about −8° C. Through contact between clamp 406 and object 402 (for example, contact between mounting surface 416 of clamp 406 and surface 412 of object 402), heat can be transferred from object 402 to clamp 406.

In some embodiments, a portion of clamp 406 that receives object 402 is maintained at a temperature lower than the target average temperature of object 402 by passing a fluid through at least one channel 408 defined by clamp 406, which conditions the temperature of the receiving portion of clamp 406. As shown in FIG. 3, clamp 406 can define a plurality of channels 408 in some embodiments. In other embodiments (not shown), clamp 406 defines a single channel 408. Channels 408 are configured to circulate the conditioned fluid through clamp 406. In some embodiments, passing fluid through channels 408 maintains the portion of clamp 406 that receives object 402 at a substantially constant temperature lower than the target average temperature of object 402. Thereby, clamp 406 continuously removes heat from object 402. Channels 408 can be configured to run parallel to mounting surface 416 of clamp 406 in some embodiments. In some embodiments, the fluid (i.e., a liquid or gas) is water, air, an alcohol, a glycol, a phase change coolant (e.g., Freons, carbon dioxide), or a combination thereof.

In some embodiments, support 400 includes a fluid conditioning device 410 that is coupled to channels 408 to condition a characteristic, for example, temperature, of the fluid before entering clamp 406 through channels 408. In some embodiments, fluid conditioning device 410 comprises one or more thermoelectric cooling devices such as a Peltier cooler or any other suitable thermoelectric cooling device. In other embodiments, fluid conditioning device 410 comprises one or more heat exchangers such as a shell and tube heat exchanger, a plate heat exchanger, or any other suitable heat exchanger. In some embodiments, fluid conditioning device 410 comprises a combination of one or more thermoelectric cooling devices and one or more heat exchangers.

In some embodiments, the fluid passing through channels 408 is recirculated. For example, the fluid exits channels 408 and clamp 406 and is then routed back to fluid conditioning device 410 via one or more ducts before entering clamp 406 via channels 408. In other embodiments, the fluid passing through channels 408 is not-recirculated and originates from a fluid source upstream from fluid conditioning device 410.

Figure 4:
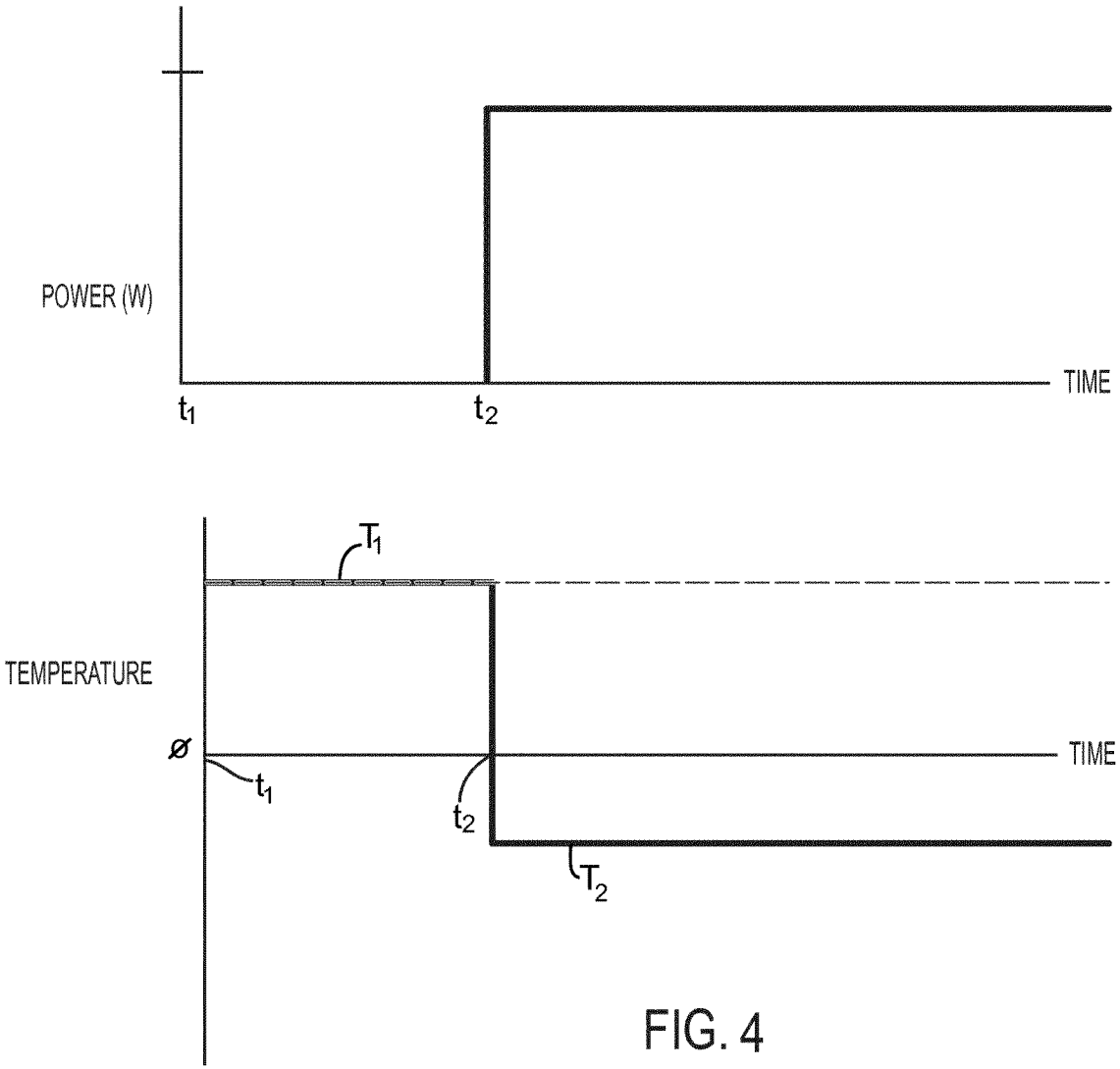
FIG. 4 illustrates a top diagram charting the exposure power of a radiation beam incident on an object as a function of time, and a bottom diagram charting the temperature of cooling fluid passing through separate channels of a clamp as a function of time, according to an embodiment.

In some embodiments, the cooling power of fluid conditioning device 410 is adjustable, for example, based on a control signal received from a controller 413. In such embodiments, the temperature of the fluid entering channels 408 within clamp 406 can be selectively adjusted. Selectively adjusting the temperature of the fluid entering channels 408 changes the temperature of surface 416 of clamp 406 and, consequently, changes the temperature of surface 412 of object 402. For example, FIG. 4 illustrates the temperature adjustable control of the fluid entering channels 408 according to an embodiment. For example, collectively referencing FIGS. 3 and 4, controller 413 can send a control signal to fluid conditioning device 410. At a first time $t_1$, fluid conditioning device 410 conditions the temperature $T_1$ of fluid entering channels 408 to have a first temperature. Then at a subsequent time $t_2$, controller 413 can send a control signal to fluid conditioning device 410 such that at time $t_2$, fluid conditioning device 410 conditions the temperature $T_2$ of fluid entering channels 408 to have a second temperature, which is different than the first temperature. In some embodiments, the second temperature of fluid entering channels 408 is less than the first temperature of fluid entering channels 408 as shown in FIG. 4. For example, the first temperature of fluid entering channels 408 at time $t_1$ can be about room temperature (for example, about 22° C.), and the second temperature of fluid entering channels 408 at time $t_2$ can be, for example, about −8° C. In some embodiments, the first temperature of fluid entering channels 408 at time $t_1$ is in a range from about 17° C. to about 27° C., for example, about 22° C. In some embodiments, the second temperature of fluid entering channels 408 at time $t_2$ is in a range from about −15° C. to about 15° C., for example, about −8° C. or 2° C.

In some embodiments, the second temperature of fluid entering channels 408 at time $t_2$ is less than a target average temperature (for example, about the zero-crossing temperature of the material composing object 402 or about 22° C.) of object 402 when object 402 device is being exposed with radiation beam 403.

In some embodiments (not shown in FIG. 4), the second temperature of fluid entering channels 408 at time $t_2$ is more than the first temperature of fluid entering channels 408 at time $t_1$.

In some embodiments, time $t_2$ at which point the temperature of fluid entering channels 408 is adjusted from the first temperature to the second temperature is switched coincides with the time at which object 402 is subject to a heating power from being exposed with radiation beam 403 as shown in FIG. 4. In other embodiments (not shown in FIG. 4), time $t_2$ does not coincide with the time at which object 402 is subject to a heating power from being exposed with radiation beam 403 as shown in FIG. 4.

In some embodiments, the second temperature of fluid entering channels 408 of clamp 406 at time $t_2$ is such that clamp 406 conditions object 402 to have an average temperature that is about equal to the zero-crossing temperature of the material composing object 402. For example, if the zero-crossing temperature of the material composing object 402 is about 22° C., the second temperature of fluid entering channels 408 at time $t_2$ is such clamp 406 conditions object 402 to have an average temperature of about to 22° C.—the zero-crossing temperature of the material composing object 402.

In some embodiments in which object 402 is conditioned to have an average temperature that is equal to about the zero-crossing temperature of the material composing object 402, the sum of the internal bending moments due to the internal thermal forces is about equal to zero (for example, as shown in the embodiments in both FIG. 8 and FIG. 14). And in addition to the sum of the internal bending moments being about equal to zero, the sum of the internal thermal forces can be about equal to zero in some embodiments (for example, when the zero-crossing temperature of the material composing object 402 is greater than the temperature of object 402 at the undeformed state as shown in FIG. 14). In such embodiments (i.e., embodiments in which the sum of internal moments is about equal to zero and/or the sum of internal thermal forces is about equal to zero), the deformation of object 402 can be reduced (which can lead to smaller and better correctable deformation shapes). One advantage of conditioning object 402 to have an average temperature that is equal to about the zero-crossing temperature of the material composing object 402 is that the sensitivity for spatial variation of the exposure heat load can be reduced. Another advantage of conditioning object 402 to have an average temperature that is equal to about the zero-crossing temperature of the material composing object 402 is that the sensitivity for spatial zero-crossing variation of the material composing object 402 can also be reduced.

In other embodiments, the second temperature of fluid entering channels 408 at time $t_2$ is such that clamp 406 conditions object 402 to have an average temperature that is less than or more than the zero-crossing temperature of the material composing object 402.

In some embodiments, the transition from the first temperature of the fluid entering channels 408 at time $t_1$ to the second temperature of fluid entering channels 408 at time $t_2$ is stepped as shown in FIG. 4. In other embodiments, the transition is not stepped.

To prevent or reduce the deformation of chuck 404 due to the cooling power of fluid passing through channels 408 of clamp 406, support 400 can be configured to condition a portion of clamp 406 between channels 408 and chuck 404. for example, a portion of clamp 406 including surface 418 of clamp 406 can be maintained at a temperature higher than the temperature of the fluid passing through channels 408. In some embodiments, a portion of clamp 406 between channels 408 and chuck 404 can be maintained at a higher temperature by passing a fluid at a temperature higher than the temperature of the fluid passing through channels 408 through at least one channel 422 between channel(s) 408 and chuck 404 and that is separate from channel(s) 408. As shown in FIG. 3, clamp 406 can define a plurality of channels 422 in some embodiments. In other embodiments (not shown), clamp 406 defines a single channel 422. Channels 422 are configured to circulate the conditioned fluid through clamp 406. Passing fluid through channels 422 maintains the portion of clamp 406 between channels 408 and chuck 404 at a substantially constant temperature higher than the temperature of the fluid passing through channels 408. Thereby, clamp 406 continuously conditions chuck 404 to have a temperature, for example, about 22° C., that prevents or reduces deformation of chuck 404.

Channels 422 can be configured to run parallel to mounting surface 416 of clamp 406 in some embodiments. In some embodiments, the fluid (i.e., a liquid or gas) passing through channels 422 is water, air, an alcohol, a glycol, a phase change coolant (e.g., Freons, carbon dioxide), or a combination thereof. As shown in FIG. 3, channels 422 are between chuck 404 and channels 408, and channels 422 are separate from channels 408 in some embodiments.

In some embodiments, support 400 includes a fluid conditioning device 411 coupled to channels 422 to condition a characteristic, for example, temperature, of the fluid passing through channels 422 before entering clamp 406. In some embodiments, fluid conditioning device 411 comprises one or more thermoelectric cooling devices such as a Peltier cooler or any other thermoelectric cooling device. In other embodiments, fluid conditioning device 411 comprises one or more heat exchangers such as a shell and tube heat exchanger, a plate heat exchanger, or any other heat exchanger. In some embodiments, fluid conditioning device 411 comprises a combination of one or more of thermoelectric cooling device and one or more heat exchangers.

In some embodiments, the fluid passing through channels 422 is recirculated. For example, the fluid exits channels 422 and clamp 406 and is then routed back to fluid conditioning device 411 via one or more ducts before entering clamp 406 via channels 422. In other embodiments, the fluid passing through channels 422 is not-recirculated and originates from a fluid source upstream from fluid conditioning device 411.

In some embodiments, the cooling power of fluid conditioning device 411 is based on a control signal received from controller 413. In some embodiments, the temperature of the fluid entering channels 422 within clamp 406 can be maintained at a constant temperature. For example, as shown in FIG. 4, controller 413 can send a control signal to fluid conditioning device 411 such that at a first time $t_1$ and a subsequent second time $t_2$, fluid conditioning device 411 conditions the fluid entering channels 422 to have a substantially constant temperature $T_2$. In some embodiments, the temperature of fluid entering channels 422 is about room temperature (for example, about 22° C.). In some embodiments, the first temperature of fluid entering channels 422 is in a range from about 17° C. to about 27° C., for example, about 22° C. In some embodiments, the temperature of fluid entering channels 422 is greater than the temperature of fluid entering channels 408 at time $t_2$ as shown in FIG. 4.

In other embodiments, the temperature conditioning power of fluid conditioning device 411 is adjustable, for example, based on a control signal received from controller 413. In such embodiments, the temperature of the fluid entering channels 422 within clamp 406 can be selectively adjusted. Selectively adjusting the temperature of the fluid entering channels 422 changes the temperature conditioning power of clamp 406 on chuck 404.

FIG. 7 illustrates the temperature of object 402 and clamp 406 having channels 408 and 422, according to an embodiment, at various times T1-T8 after (1) object 402 is exposed with radiation beam 403, and (2) the temperature of fluid entering channels 408 is adjusted from a first temperature to a lower second temperature. In this embodiment, the cooling power on object 402 generated by passing fluid through channels 408 at the second temperature is about equal to a heating power applied to object 402 during exposure with radiation 403, and the average temperature of object 402 remains over time about equal to the zero-crossing temperature of the material composing object 402. For example, when object 402 is exposed with 80 W from radiation beam 403, the temperature of fluid entering channels 408 is adjusted from about 22° C. to about −8° C. such that the cooling power on surface 412, over time, is about equal to 80 W heating power absorbed by object 402 during exposure with radiation 403. Accordingly, the average temperature of object 402 remains, over time, equal to about to room temperature, for example, about 22° C., which is also about the zero-crossing temperature of the material composing object 402 in some embodiments.

In FIG. 7, the horizontal axis corresponds to a position on object 402 or clamp 406 in a direction substantially perpendicular to mounting surface 416 of clamp 406 and surface 414 of object 402. For example, the dashed line at the right end of the horizontal axis corresponds to surface 414 of object that receives radiation beam 403. The dashed line at the left end of the horizontal axis corresponds to surface 418 of clamp 406 that is adjacent chuck 404. The intermediate dashed line 416, 412 to the left of dashed lane 414 corresponds to the interface between mounting surface 416 of clamp 406 and surface 412 of object 402, which is adjacent to mounting surface 416. The dashed line 408 to the left of dashed line 416, 412 corresponds to the location of channels 408 of clamp 406, and the dashed line to the left of dashed line 408 corresponds to the location of channels 422. Notably, the discontinuity of the temperatures at the interface 416, 412 between mounting surface 416 of clamp 406 and surface 412 of object 402 is due to the thermal resistance of a back-fill pressure between clamp 406 and object 402.

As shown in FIG. 7, after surface 414 of object 402 is exposed with a 80 W radiation beam 403 and after the temperature of fluid entering channels 408 is adjusted to about −8° C., the temperature of a portion of object 402 including surface 414 increases from about 22° C. from time T1 to time T8, and the temperature of a portion of object 402 including surface 412 decreases from time T1 to time T8. Object 402 has a thickness in the range of about 4 mm to about 8 mm and comprises a material having ultra-low coefficient of thermal expansion that varies as a function of temperature and has a zero-crossing temperature of about 22° C. In some embodiments, clamp 406 has a thickness in the range of about 6 mm to about 10 mm, for example, 8 mm, and comprises a material having ultra-low coefficient of thermal expansion that varies as a function of temperature and has a zero-crossing temperature of about 22° C. (Although in some embodiments, clamp 406 comprises a material having ultra-low coefficient of thermal expansion that has a zero-crossing temperature, for example, about 8° C., less than the zero-crossing temperature of the material composing object 402.) In some embodiments, time T8 is about 200 seconds after surface 414 of object 402 is exposed with radiation beam 403 and after the temperature of fluid entering channels 408 is adjusted to the lower temperature, for example, about −8° C.

As shown in FIG. 7, the average temperature of object 402 at times T1-T8 is about 22° C., which is about the zero-crossing temperature of the material composing object 402 in some embodiments. The portion of object 402 including surface 414 of object 402 is hotter than about 22° C. (i.e., hotter than about the zero-crossing temperature of the material composing object 402), and the portion of object 402 including surface 412 of object 402 is colder than about 22° C. (i.e., colder than about the zero-crossing temperature of the material composing object 402). For example, the temperature of object 402 at surface 414 can be about 38° C. when exposed with radiation 403 at time T8. The temperature of object 402 decreases in the direction of clamp 406 until the temperature of object 402 at about the midpoint of object 402 is about 22° C. (i.e., about the zero-crossing temperature of the material composing object 402). From that point on object 402, the temperature of object 402 continues to decrease in the direction of clamp 406 until the temperature of object 402 is about 10° C. at surface 412 of object 402 at time T8.

Due to the resulting cooling by clamp 406, the average temperature of object 402 remains (during substantially the entire transition from time T1 to time T8 in some embodiments) at about the zero-crossing temperature of the material composing object 402, for example, at about 22° C. And in some embodiments as shown in FIG. 7, the difference between the average temperature of object 402 (about the zero-crossing temperature of the material composing object 402) and the temperature of object 402 at surface 412 is about equal to the difference between the average temperature of object 402 (about the zero-crossing temperature of the material composing object 402) and the temperature of object 402 at surface 414 during the transition from time T1 to time T8. This temperature distribution can generate a substantially symmetric internal thermal force distribution about an axis substantially parallel to surface 414 of object 402 due to expansion of object 402 as shown in FIG. 8. In FIG. 8, force F1 corresponds to the internal thermal force generated at surface 414 of object 402 having a temperature of about 38° C., and force F2 corresponds to the internal thermal force generated in object 402 at a point between surface 414 and the point in object 402 having a temperature of about 22° C. (i.e., about the zero-crossing temperature of the material composing object 402). Force F3 corresponds to the internal thermal force generated in object 402 at a point between the point in object 402 having a temperature of about 22° C. and surface 412 of object 402, and force F4 corresponds to the internal thermal force generated at surface 412 of object 402. FIG. 9 schematically diagrams the distribution of forces F1-F4 on object 402.

As shown in FIG. 9, forces F1-F4 are substantially symmetrical about an axis parallel with surface 414 of object 402 that intersects a point on object 402 having a temperature equal to about the zero-crossing temperature of the material composing object 402, for example, about 22° C. This substantially symmetric force distribution can help reduce the internal bending moments applied to object 402 by internal thermal forces generated by expansion of object 402, which can help reduce deformation of object 402.

FIG. 14 illustrates another example of a symmetric internal thermal force distribution about an axis substantially parallel to surface 414 of object 402 due to expansion of object 402 that can be achieved from the resulting cooling by clamp 406. In this embodiment, object 402 is composed of a material having a zero-crossing temperature (for example, about 30° C. as shown in FIG. 14) that is greater than a temperature of object 402 at its undeformed state (for example, about 20° C. as shown in FIG. 14). In FIG. 14, force F1 corresponds to the internal thermal force generated at surface 414 of object 402 having a temperature of about 45° C., and force F2 corresponds to the internal thermal force generated at a midpoint of object 402 having a temperature of about 30° C. (i.e., about the zero-crossing temperature of the material composing object 402). Force F3 corresponds to the internal thermal force generated at surface 412 of object 402 having a temperature of about 15° C. In FIG. 14, the sum of the internal bending moments due to the internal thermal forces equal to about zero due to the symmetric internal thermal force distribution. Also, the sum of the internal thermal forces in a plane parallel to surface 414 of object 402 is about equal to zero. Reducing the sum of the internal bending moments due to internal thermal forces or by reducing the sum of internal thermal forces can reduce deformation of object 402.

In embodiments in which object 402 is a patterning device, reducing deformation of object 402 and chuck 404 by passing fluid through channels 408 and 422 can reduce overlay errors over a pattern exposed on a substrate. For example, FIG. 10 charts the raw overlay error of a pattern exposed on a substrate as a function of the position on the substrate at various times T1-T8 after object 402 is exposed with radiation beam 403 using support 400, according to an embodiment. In this embodiment, clamp 406 and object 402 have a temperature distribution as shown in FIG. 7, clamp 406 comprises a material having ultra-low coefficient of thermal expansion that varies as a function of temperature, and object 402 comprises a material having ultra-low coefficient of thermal expansion that varies as a function of temperature. In in this embodiment, the material composing clamp 406 has a zero-crossing temperature, for example, about 22° C., that is about equal to the zero-crossing temperature, for example, about 22° C., of the material composing object 402. In FIG. 10, times T1-T8 correspond with times T1-T8 in FIG. 7. In some embodiments, T8 can be about 200 seconds (for example, 214 seconds) as shown in FIG. 7, and the maximum raw overlay error along the substrate from times T1-T8 is about 0.5 nm as shown in FIG. 10.

FIG. 11 charts the raw overlay error of a pattern exposed on a substrate as a function of the position on the substrate at various times T1-T8 after object 402 is exposed with radiation beam 403 using support 400, according to another embodiment. In this embodiment, clamp 406 and object 402 have a temperature distribution as shown in FIG. 7, clamp 406 comprises a material having ultra-low coefficient of thermal expansion that varies as a function of temperature, and object 402 comprises a material having ultra-low coefficient of thermal expansion that varies as a function of temperature. In in this embodiment, the material composing clamp 406 has a zero-crossing temperature, for example, about 8° C., that is less than about the zero-crossing temperature, for example, about 22° C., of the material composing object 402. In FIG. 11, times T1-T8 correspond with times T1-T8 in FIG. 7. In some embodiments, time T8 can be about 200 seconds (for example, 214 seconds) as shown in FIG. 7, and the maximum raw overlay error along the substrate from times T1-T8 is about 0.1 nm as shown in FIG. 11. The reduction in raw overlay error in this embodiment relative to the embodiment in FIG. 10 is attributable, at least in part, to internal thermal forces generated in clamp 406. When clamp 406 has a temperature distribution as shown in FIG. 7, the internal forces generated in clamp 406 will be in the opposite direction of internal thermal expansion forces F1-F4 (see FIG. 9) generated in object 402. These internal compressive thermal forces generated in clamp 406 can resist the internal expansion thermal forces F1-F4 (see FIG. 9) generated in object 402, which can help reduce deformation of object 402 and, in turn, reduce the overlay error at the substrate.

In some embodiments, support 400 includes a pellicle 424 as shown in FIG. 12. For example, one side of pellicle 424 can be mounted to a lateral end portion 426 of object 402 and the other side of pellicle 424 can be mounted to the opposing lateral end portion 428 of object 402. In some embodiments, support 400 includes a mount 430, for example, a silicon carbide or metal stud, coupled to surface 414 of object 402 at lateral end portion 426 on one end of mount 430 and coupled to pellicle 424 on the other end of mount 430. Support 400 also includes a mount 432, for example, a silicon carbide or metal stud, coupled to surface 414 of object 402 at lateral end portion 428 on one end of mount 432 and coupled to pellicle 424 on the other end of mount 432. Mounts 430 and 432 can be adhered directly to surface 414 of object 402 in some embodiments. In some embodiments, lateral end portions 426 and 428 correspond to portions of object 402 that are not included in the field of exposure and that are not aligned with interfaces between object 402 and clamp 406 that are back filled.

In some embodiments, controller 413 controls the temperature of the fluid passing through channels 408 such that lateral end portions 426 and 428 of object 402 are maintained at substantially room temperature (for example, about 22° C.). FIG. 13 illustrates the temperature of surface 414 of object 402 having channels 408 and 422 according to one such embodiment at various times T1-T6 after: (1) object 402 is exposed with radiation beam 403; and (2) the temperature of fluid entering channels 408 is adjusted from a first temperature to a lower second temperature as described in the above embodiments. In some embodiments, time T6 is about 300 seconds or more after exposure with radiation beam 403 starts. In this embodiment, the temperature of surface 414 of object 402 at lateral end portions 426 and 428 is about room temperature, for example, about 22° C. Accordingly, mounts 430 and 432 will also remain at about room temperature, for example, about 22° C. Maintaining mounts 430 and 432 at about room temperature can help reduce expansion of mounts 430 and 432 during exposure, which in turn can reduce local deformations of object 402.

In some embodiments, the portion of clamp 406 adjacent chuck 404, for example, the portion including channels 422, is thermally isolated from the portion of chuck 404 that includes channels 408 by forming voids in clamp 406 there between. FIG. 15 illustrates one such embodiment of clamp 406. As shown in FIG. 15, clamp 406 includes a first layer 434, a second layer 436, and a third layer 438. First layer 434 includes a plurality of burls 440 that define surface 416 that receives object 402. Second layer 436 defines channels 408, and third layer 438 includes a plurality of burls 442 that define a plurality of voids 444. Third layer 438 is coupled to chuck 404 at surface 418 of clamp 406.

In some embodiments, first, second, and third layers 434, 436, and 438 are optically coupled to each other by anodic or fusion bonding. For example, first and second layers 434 and 436 can be fusion bonded together at interface 448, and second and third layers 436 and 438 can be fusion bonded together at interface 446. And third layer 438 can be optically coupled to chuck 404 (not shown) at surface 418. After bonding, first, second, and third layers 434, 436, and 438 is monolithic in some embodiments.

In other embodiments, clamp 406 is a single layer defining voids 444, channels 408, and channels 422.

In some embodiments, a vacuum is formed in voids 444. In some embodiments, the vacuum occurs during operational use of the lithographic apparatus. In other embodiments, voids 444 are filled with a thermally insulating fluid, for example, air or any other insulating fluid. In some embodiments, voids 444 reduce thermal conduction between third layer 438 adjacent chuck 404 and second layer 436 that includes channels 408 by a factor of 50-100 relative to a similar clamp without voids 444. In some embodiments, this thermal insulation provided by voids 444 allows first and second layers 434 and 436 to operate at temperatures substantially lower than room temperature or 22° C., for example, at temperatures below 2° C., while third layer 438 maintains a temperature about equal to the temperature of chuck 404 at its undeformed, manufactured state, for example, about room temperature or 22° C. This configuration can reduce residual thermal errors in chuck 404 while also improving chuck stability and manufacturing.

Voids 444 decrease the thermal coupling (i.e., thermally isolates) between the portion of clamp 406 including channels 408 (for example, first layer 434 or second layer 436) from the portion of clamp 406 adjacent chuck 404 (for example, third layer 438). When clamp 406 includes channels 422, the resulting thermal isolation allows for a smaller temperature difference between the fluids passing through channels 408 and 422 and/or a smaller distance between channels 408 and 422, which can improve scale stability and chuck flatness.

In some embodiments, channels 422 can be omitted from clamp 406. Because voids 444 thermally isolate the portion of clamp 406 contacting chuck 404 from the portion of clamp 406 that includes channels 408, conditioning of chuck 404 via fluid flow in channels 422 is rendered unnecessary.

In some embodiments, the surface area of burls 442 that interface second layer 436 is less than 50 percent the surface area of the surface of second layer 436 facing third layer 438. In some embodiments, the surface area of burls 442 that interface second layer 436 is less than 10 percent the surface area of the surface of second layer 436 facing third layer 438.

In some embodiments, each of layers 434, 436, and 438 is composed of one or more materials having ultra-low coefficients of thermal expansion that vary as a function of temperature. For example, the material composing layers 434, 436, and 438 can be ultra-low expansion silicon-based materials (e.g., ULE® glass manufactured by Corning), glass materials, ceramic materials, silicon-based glass ceramic materials (e.g., ZERODUR® glass ceramic manufactured by SCHOTT), or a combination thereof.

In some embodiments, instead of clamp 406 having voids 444 as shown in FIG. 15, chuck 404 can have voids 464 that thermally isolate chuck 404 from clamp 406 as shown in FIG. 16. This configuration (i.e., voids 464 in chuck 404 instead of clamp 406) can simplify the structure of clamp 406. For example, forming voids 464 in chuck 404, instead of clamp 406, can reduce the number of layers forming clamp 406. In FIG. 15, clamp 406 having voids 444 is formed of three layers, but in FIG. 16, clamp 406 without voids 444 is formed of two layers.

As shown in FIG. 16, clamp 406 can be made of a plurality of layers. For example, clamp 406 can include a first layer 450 and a second layer 452. First layer 450 includes plurality of burls 440 that define surface 416 that receives object 402. Second layer 452 defines channels 408 and is coupled to chuck 404.

In other embodiments (not shown), first layer 450 defines channels 408.

In other embodiments (not shown), clamp 406 is formed of a single layer or of more than two layers.

Although burls 440 in FIG. 16 have a trapezoidal cross-sectional shape, burls 440 can have other suitable cross-sectional shapes, for example, a rectangular, triangular, or hemispherical shape.

Again, clamp 406 can be an electrostatic clamp that generates an electrostatic field to hold object 402 in place in some embodiments. In such electrostatic embodiments, one or more of layers 450 and 452 can include electrodes (not shown) that generate this electrostatic field.

As shown in FIG. 16, chuck 404 can be made of a plurality of layers. For example, chuck 404 can include a first layer 454 that defines surface 420 coupled to second layer 452 of clamp 406, and a second layer 456 coupled to first layer 454.

In other embodiments (not shown), first layer 454 can be omitted such that layer 456 defining voids 464 is coupled directly to clamp 406 (for example, to layer 452 of clamp 406.) In other embodiments (not shown), more than one layer of chuck 404 can be positioned between layer 456 defining voids 464 and clamp 406. In other embodiments, chuck 404 is formed of a single layer or of more than two layers (for example, three, four, or five layers). For example, first and second layers 454 and 456 of chuck 404 can be a single integral layer defining voids 464.

In some embodiments, each of layers 450, 452, 454, and 456 is composed of one or more materials having ultra-low coefficients of thermal expansion that vary as a function of temperature. For example, the material composing layers 450, 452, 454, and 456 can be ultra-low expansion silicon-based materials (e.g., ULE® glass manufactured by Corning), glass materials, ceramic materials, silicon-based glass ceramic materials (e.g., ZERODUR® glass ceramic manufactured by SCHOTT), or a combination thereof.

An interface 458 between surface 418 of clamp 406 and surface 420 of chuck 404 can be optically coupled. For example, in some embodiments, in which chuck 404 and clamp 406 are made of glass materials, ceramic materials, or silicon-based glass ceramic materials (e.g., ZERODUR® glass ceramic manufactured by SCHOTT), interface 458 can be an anodic bond. In some embodiments, in which chuck 404 and clamp 406 are made of ultra-low expansion silicon-based materials (e.g., ULE® glass manufactured by Corning), interface 458 can be a fusion bond.

In some embodiments, first and second layers 450 and 452 of clamp 406 and first and second layers 454 and 456 of chuck 404 are optically coupled to each other by anodic or fusion bonding. For example, first and second layers 450 and 452 of clamp 406 can be fusion or anodic bonded together at interface 448, and first and second layers 436 and 438 can be fusion or anodic bonded together at interface 446. After bonding, first and second layers 450 and 452 of clamp 406 and first and second layers 454 and 456 of chuck 404 are monolithic in some embodiments.

In some embodiments, second layer 456 of chuck 404 includes a plurality of burls 462 that define a plurality of voids 464 as shown in FIG. 16. Although burls 462 in FIG. 16 have a trapezoidal cross-sectional shape, burls 462 can have other suitable cross-sectional shapes, for example, a rectangular, triangular, or hemispherical shape. Similarly, although voids 464 in FIG. 16 have a trapezoidal cross-sectional shape, voids 464 can have other suitable cross-sectional shapes, for example, a rectangular, triangular, arcuate, or circular shape.

In other embodiments, chuck 404 is a single layer defining voids 464. In some embodiments, a vacuum is formed in voids 464. In some embodiments, the vacuum occurs during operational use of the lithographic apparatus. In other embodiments, voids 464 are filled with a thermally insulating fluid, for example, air or any other insulating fluid.

Voids 464 decreases the thermal coupling (i.e., thermally isolates) between (i) first layer 454 of chuck 404 that is adjacent clamp 406 and (ii) second layer 456 of chuck 404 that includes voids 464, which in turn reduces thermal coupling between clamp 406 and chuck 404. This thermal insulation provided by voids 464 allows second layer 454 of chuck 404 and clamp 406 to operate at temperatures substantially lower than room temperature or 22° C., for example, at temperatures below 2° C., while second layer 456 of chuck 404 maintains a temperature about equal to the temperature of chuck 404 at its undeformed, manufactured state, for example, about room temperature or 22° C. This configuration can reduce residual thermal errors in chuck 404 while also improving chuck stability and manufacturing.

In embodiments in which voids 464 are filled with a thermally insulating fluid and/or in which fluid circulating channels 466 are optionally formed in second layer 456 of chuck 404, the resulting thermal isolation from voids 464 allows for (1) a smaller temperature difference between the fluids passing through channels 408 and voids 464 or channels 466, and/or (2) a smaller distance between channels 408 chuck 404, which can improve scale stability and chuck flatness.

In some embodiments, channels 466 can be omitted from chuck 406. Because voids 464 thermally isolate chuck 404 from the portion of clamp 406 that includes channels 408, conditioning of chuck 404 via fluid flow in channels 466 is rendered unnecessary.

In some embodiments, the surface area of burls 462 that interface with first layer 454 of clamp 406 is less than 50 percent the surface area of the surface of first layer 454 facing second layer 456 of chuck 404. In some embodiments, the surface area of burls 462 that interface first layer 454 of chuck 404 is less than 10 percent the surface area of the surface of first layer 454 facing second layer 456 of chuck 404.

In some embodiments, the temperature of fluid flowing through channels 408 of clamp 406 (and channels 466) is controlled as described in any one of the described embodiments of this application.

Example Embodiments of Object Temperature Control Methods

In use, any of the above embodiments of support 400 can control a temperature of object 402 held by clamp 406, which is coupled to chuck 404 of a lithographic apparatus. For example, in some embodiments, a method of cooling object 402 using clamp 406 and chuck 404 includes exposing object 402 with radiation beam 403. In some embodiments, exposing object 402 with radiation beam 403 is part of the process of manufacturing ICs. For example, exposing object 402 with radiation beam 403 includes exposing a reticle with radiation to impart a pattern on the radiation beam.

The method of cooling object 402 using clamp 406 and chuck 404 includes can also include conditioning a temperature of a first portion of clamp 406. For example, the temperature of a portion of clamp 406 having channels 422 and surface 418 coupled to a surface 420 of chuck 404 can be conditioned by passing fluid at a first temperature, for example, about 22° C., through channels 422. The method can also include conditioning a temperature of a second portion of clamp 406, for example, a portion of clamp 406 having channels 408 and surface 416, holding object 402 by passing a fluid at a temperature lower than the temperature of the fluid passing through channels 422 through channels 408. In some embodiments, the fluid passing through channels 408 is conditioned to have different temperatures at different points in time. For example, before passing fluid through channels 408 at a temperature lower than the temperature of fluid passing through channels 422, the fluid passing through channels 408 can be conditioned to have a temperature, for example, about 22° C., that is about equal to the temperature of fluid passing through channels 422. In some embodiments, controller 413 can then transmit a control signal to fluid conditioning device 410 to adjust the temperature of fluid passing through channels 408 from the higher temperature, for example, about 22° C., to the lower temperature, for example, −8° C., as shown in FIG. 4. The change in temperature can coincide with the start of object 402 being exposed with radiation beam 403 as shown in FIG. 4.

In some embodiments, object 402 is loaded on clamp 406 while the fluid passing through channels 408 is conditioned to have a temperature, for example, about 22° C., that is about equal to the temperature of fluid passing through channels 422.

In some embodiments, the method of cooling object 402 includes conditioning the fluid passing through channels 408 to have a temperature, for example, −8° C., that is less than a target average temperature, for example, about 22° C., of object 402 when exposed with radiation beam 403. In some embodiments, the target average temperature of object 402 is about the zero-crossing temperature of the material composing object 402.

In some embodiments, the method of cooling object 402 includes conditioning the fluid passing through channels 408 to have a temperature, for example, about −8° C., such that the cooling power on object 402 generated by passing fluid through channels 408 is about equal to a heating power, for example, about 80 W, applied to object 402 during exposure with radiation beam 403.

In some embodiments, the method of cooling object 402 includes conditioning the fluid passing through channels 408 to have a temperature, for example, about −8° C., such that generated internal thermal forces of object 402 when object 402 is being exposed with radiation beam 403 are substantially symmetric about an axis substantially parallel with surface 414 of object 402. In such embodiments, the sum of the internal bending moments in object 402 due to the internal thermal forces is about zero. For example, fluid passing through channels 408 can be conditioned to have a temperature that generates internal thermal forces as shown in FIG. 9.

In some embodiments, after object 402 is exposed with radiation beam 403, the fluid passing through channels 408 is conditioned to have a temperature, for example, about 22° C., that is about equal to the temperature of fluid passing through channels 422. For example, after exposing object 402 to radiation beam 403, controller 413 can transmit a control signal to fluid conditioning device 410 to adjust the temperature of fluid passing through channels 408 from the lower temperature, for example, about −8° C., to the higher temperature, for example, about 22° C. The change in temperature can coincide with cessation of object 402 being exposed with radiation beam 403.

Any one of the above described embodiments for controlling the temperature of an object 402 and chuck 404 can be used to manufacture ICs. For example, the object 402 can be a reticle used to impart a pattern of one layer of an IC on radiation beam 403 that will be exposed on a wafer.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measures or processes an object such as a wafer (or other substrate) or mask (or other patterning device) either in vacuum or in ambient (non-vacuum) conditions, such as, for example in plasma etching apparatus or deposition apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The terms "radiation" and "beam" as used herein encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as beams of charged particles, such as ion beams or electron beams.

The term "lens", where the context allows, may refer to any one or combination of various types of optical components, including refractive, reflective, magnetic, electromagnetic and electrostatic optical components.

The term "etch" or "etching" or "etch-back" as used herein generally describes a fabrication process of patterning a material, such that at least a portion of the material remains after the etch is completed. For example, generally the process of etching a material involves the steps of patterning a masking layer (e.g., photoresist or a hard mask) over the material, subsequently removing areas of the material that are no longer protected by the mask layer, and optionally removing remaining portions of the mask layer. Generally, the removing step is conducted using an "etchant" that has a "selectivity" that is higher to the material than to the mask layer. As such, the areas of material protected by the mask would remain after the etch process is complete. However, the above is provided for purposes of illustration, and is not limiting. In another example, etching may also refer to a process that does not use a mask, but still leaves behind at least a portion of the material after the etch process is complete.

The above description serves to distinguish the term "etching" from "removing." In an embodiment, when etching a material, at least a portion of the material remains behind after the process is completed. In contrast, when removing a material, substantially all of the material is removed in the process. However, in other embodiments, 'removing' may incorporate etching.

The terms "deposit" or "dispose" as used herein describe the act of applying a layer of material to a substrate. Such terms are meant to describe any possible layer-forming technique including, but not limited to, thermal growth, sputtering, evaporation, chemical vapor deposition, epitaxial growth, atomic layer deposition, electroplating, etc.

The term "substrate" as used herein describes a material onto which subsequent material layers are added. In embodiments, the substrate itself may be patterned and materials added on top of it may also be patterned, or may remain without patterning.

The term "substantially" or "in substantial contact" as used herein generally describes elements or structures in physical substantial contact with each other with only a slight separation from each other which typically results from fabrication and/or misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include fabrication and/or misalignment tolerances without departing from the spirit and scope of the present disclosure.

While specific embodiments have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A lithographic apparatus comprising:

a clamp, configured to receive an object [and], comprising:

a first layer including [at least one first channel arranged to be] *a first plurality of burls defining a first plurality of voids* adjacent to the object [and configured to pass a first fluid at a first fluid temperature], a third layer including [at least one second channel configured to pass a third fluid at a third fluid temperature] *a second plurality of burls defining a second plurality of voids, wherein the second plurality of voids is configured to be held at a vacuum during operation*, and a second layer sandwiched between the first layer and the third layer, the second layer including at least one [void] *channel* configured to [thermally insulate the at least one first channel and the at least one second channel] *circulate a first fluid at a first fluid temperature*;

*a fluid conditioning device coupled to the at least one channel;* and a chuck coupled to the third layer of the clamp.

2. The lithographic apparatus of claim 1, wherein the [at least one void is] *first plurality of voids is configured to be held* at a vacuum *during operation*.

[3. The lithographic apparatus of claim 1, wherein the at least one void is filled with a second fluid.]

[4. The lithographic apparatus of claim 1, wherein the at least one void comprises a plurality of voids.]

5. The lithographic apparatus of claim 1, [further comprising a] *wherein the* fluid conditioning device *is* configured to change a temperature of the first fluid.

6. The lithographic apparatus of claim 5, wherein the fluid conditioning device is configured to change a temperature of the first fluid from a second fluid temperature to the first fluid temperature.

7. The lithographic apparatus of claim 6, wherein:

the fluid conditioning device is configured to change the temperature of the first fluid from the second fluid temperature to the first fluid temperature when the object is being exposed with radiation, and the second fluid temperature is greater than the first fluid temperature.

8. The lithographic apparatus of claim 6, wherein the first fluid temperature is in a range from about −15° C. to about 15° C., and wherein the second fluid temperature is in a range from about 17° C. to about 27° C.

9. The lithographic apparatus of claim 1, wherein the first fluid temperature is less than a target average temperature of the object when the object is being exposed with radiation.

10. The lithographic apparatus of claim 1, wherein:

the object comprises a material having a coefficient of thermal expansion that varies as a function of temperature;

the coefficient of thermal expansion of the material of the object is about zero at a zero-crossing temperature of the object; and the first fluid temperature is such that an average temperature of the object when the object is being exposed with radiation is equal to about the zero-crossing temperature of the object.

11. The lithographic apparatus of claim 1, wherein the first fluid temperature is such that internal forces of the object when the object is being exposed with radiation are substantially symmetric in a direction perpendicular to a surface of the clamp holding the object.

12. The lithographic apparatus of claim 1, wherein the first fluid temperature is such that a sum of the internal forces of the object when the object is being exposed with radiation is about equal to zero.

13. The lithographic apparatus of claim 1, wherein the at least one first channel comprises a plurality of first channels, and wherein the object is a patterning device.

14. A method for controlling a temperature of an object held by a clamp of a lithographic apparatus, the method comprising:

exposing an object with radiation; [passing] *and circulating* a first fluid at a first fluid temperature through at least one first channel defined by a [first] *second* layer of the clamp to condition a temperature of the [first] *second* layer of the clamp; [passing a third fluid at a third fluid temperature through at least one second channel defined by a third layer of the clamp to condition a temperature of the third layer of the clamp;]

wherein [the clamp includes a] *the at least one channel is coupled to a fluid conditioning device and the* second layer *is* sandwiched between [the] *a* first layer and [the] *a* third layer, the [second] *first* layer including [at least one void configured to thermally insulate the at least one first channel and the at least one second channel] *a first plurality of burls defining a first plurality of voids adjacent to the object, the third layer including a second plurality of burls defining at a second plurality of voids, the second plurality of voids being configured to be at a vacuum during operation*, wherein the third layer of the clamp is coupled to a chuck.

15. The method of claim 14, further comprising:

before passing the first fluid at the first fluid temperature through the at least one first channel, passing the first fluid at a second fluid temperature through the at least one first channel to condition the temperature of the first layer of the clamp; and after passing the first fluid at the second fluid temperature through the at least one first channel, changing the second fluid temperature of the first fluid to the first fluid temperature of the first fluid, wherein the second fluid temperature is greater than the first fluid temperature.

16. The method of claim [14] *15*, wherein:

the first fluid temperature is conditioned to be in a range from about −15° C. to about 15° C.; and the second fluid temperature is conditioned to be in a range from about 17° C. to about 27° C.

17. The method of claim 16, wherein:

the first fluid temperature is conditioned to be about −8° C.; and the second fluid temperature is conditioned to be about 22° C.

18. The method of claim 14, wherein the first fluid temperature is conditioned to be less than an average temperature of the object when exposing the object with radiation.

19. The method of claim 14, wherein:

the object comprises a material having a coefficient of thermal expansion that varies as a function of temperature;

the coefficient of thermal expansion of the material of the object is about zero at a zero-crossing temperature; and passing the fluid at the first fluid temperature through the at least one channel generates an average temperature of the object when exposing the object with radiation that is equal to about the zero-crossing temperature of the material of the object.

20. A clamp configured to be arranged in a lithography system to receive an object, comprising:

a first layer including [at least one first channel] *a first plurality of burls defining a first plurality of voids* arranged to be adjacent to the object [and configured to pass a first fluid at a first fluid temperature], a third layer including [at least one second channel arranged to be adjacent to a chunk and configured to pass a third fluid at a third fluid temperature] *a second plurality of burls defining a second plurality of voids, arranged to be adjacent to a chuck, wherein the second plurality of voids is configured to be held at a vacuum during operation*; [and]

a second layer sandwiched between the first layer and the third layer, the second layer including at least one [void] *channel* configured to [thermally insulate the at least one first channel and the at least one second channel] *circulate a first fluid at a first fluid temperature; and*

*a fluid conditioning device coupled to the at least one channel.*

21. The clamp of claim 20, wherein the [at least one void is at a vacuum] *first plurality of voids is configured to be held at a vacuum during operation.*

[22. The clamp of claim 20, wherein the at least one void is filled with a second fluid.]

[23. The clamp of claim 20, wherein the at least one void comprises a plurality of voids.]

24. The clamp of claim 20, wherein the [at least one first channel is connected to a] fluid conditioning device *is* configured to change a temperature of the first fluid.

*25. A support comprising:*

*a clamp configured to receive an object and comprising:*

*a first layer including a first plurality of burls defining a first plurality of voids adjacent to the object,*

*a third layer including a second plurality of burls defining a second plurality of voids, wherein the second plurality of voids is configured to be held at a vacuum during operation, and*

*a second layer sandwiched between the first layer and the third layer, the second layer including at least one first channel configured to circulate a first fluid at a first fluid temperature;*

*a fluid conditioning device coupled to the at least one first channel; and*

*a chuck coupled to the third layer of the clamp.*

*26. The support of claim 25, wherein the first plurality of voids is configured to be at a vacuum during operation.*

*27. The support of claim 25, wherein the fluid conditioning device is configured to change a temperature of the first fluid.*

*28. The support of claim 27, wherein the fluid conditioning device is configured to change a temperature of the first fluid from a second fluid temperature to the first fluid temperature.*

*29. The support of claim 28, wherein:*

*the fluid conditioning device is configured to change the temperature of the first fluid from the second fluid temperature to the first fluid temperature when the object is being exposed with radiation, and*

*the second fluid temperature is greater than the first fluid temperature.*

*30. The support of claim 29, wherein the first fluid temperature is in a range from about −15° C. to about 15° C., and wherein the second fluid temperature is in a range from about 17° C. to about 27° C.*

*31. The support of claim 25, wherein the first fluid temperature is less than a target average temperature of the object when the object is being exposed with radiation.*

*32. The support of claim 25, wherein:*

*the object comprises a material having a coefficient of thermal expansion that varies as a function of temperature;*

*the coefficient of thermal expansion of the material of the object is about zero at a zero-crossing temperature of the object; and*

*the first fluid temperature is such that an average temperature of the object when the object is being exposed with radiation is equal to about the zero-crossing temperature of the object.*

*33. The support of claim 25, wherein the first fluid temperature is such that internal forces of the object when the object is being exposed with radiation are substantially symmetric in a direction perpendicular to a surface of the clamp holding the object.*

*34. The support of claim 25, wherein the first fluid temperature is such that a sum of the internal forces of the object when the object is being exposed with radiation is about equal to zero.*

*35. The support of claim 25, wherein the at least one first channel comprises a plurality of first channels, and wherein the object is a patterning device.*

*36. The support of claim 25, wherein the third layer further includes at least one second channel configured to circulate a second fluid at a temperature higher than the temperature of the first fluid.*

*37. The support of claim 36, wherein the at least one second channel comprises a plurality of second channels.*

*38. The support of claim 25, wherein the first layer and the second layer are optically coupled to each other at a first interface, and the second layer and the third layer are optically coupled to each other at a second interface.*

*39. A method for controlling a temperature of an object held by a clamp, the method comprising:*

*exposing the object with radiation; and*

*circulating a first fluid at a first fluid temperature through at least one first channel defined by a second layer of the clamp to condition a temperature of the second layer of the clamp, wherein the at least one first channel is coupled to a fluid conditioning device,*

*wherein the second layer is sandwiched between a first layer and a third layer, the first layer including a first plurality of burls defining a first plurality of voids, the third layer including a second plurality of burls defining a second plurality of voids,*

*wherein the second plurality of voids is configured to be held at a vacuum during operation, and*

*wherein the third layer of the clamp is coupled to a chuck.*

*40. The method of claim 39, further comprising:*

*before passing the first fluid at the first fluid temperature through the at least one first channel, passing the first fluid at a second fluid temperature through the at least one first channel to condition the temperature of the first layer of the clamp; and*

*after passing the first fluid at the second fluid temperature through the at least one first channel, changing the second fluid temperature of the first fluid to the first fluid temperature of the first fluid, wherein the second fluid temperature is greater than the first fluid temperature.*

*41. The method of claim 40, wherein:*

*the first fluid temperature is conditioned to be in a range from about −15° C. to about 15° C.; and*

*the second fluid temperature is conditioned to be in a range from about 17° C. to about 27° C.*

*42. The method of claim 41, wherein:*

*the first fluid temperature is conditioned to be about −8° C.; and*

*the second fluid temperature is conditioned to be about 22° C.*

*43. The method of claim 39, wherein the first fluid temperature is conditioned to be less than an average temperature of the object when exposing the object with radiation.*

*44. The method of claim 39, wherein:*

*the object comprises a material having a coefficient of thermal expansion that varies as a function of temperature;*

*the coefficient of thermal expansion of the material of the object is about zero at a zero-crossing temperature; and*

*passing the fluid at the first fluid temperature through the at least one channel generates an average temperature*

*of the object when exposing the object with radiation that is equal to about the zero-crossing temperature of the material of the object.*

*45. A clamp configured to receive an object, comprising:*

*a first layer including a first plurality of burls defining a first plurality of voids adjacent to the object;*

*a third layer including a second plurality of burls defining a second plurality of voids arranged to be adjacent to a chuck and configured to be held at a vacuum during operation; and*

*a second layer sandwiched between the first layer and the third layer, the second layer including at least one first channel configured to circulate a first fluid at a first fluid temperature, wherein the at least one first channel is coupled to a fluid conditioning device.*

*46. The clamp of claim 45, wherein the first plurality of voids is configured to be held at a vacuum during operation.*

*47. The clamp of claim 45, wherein the fluid conditioning device is configured to change a temperature of the first fluid.*

*48. The clamp of claim 45, wherein the third layer further includes at least one second channel configured to circulate a second fluid at a temperature higher than the temperature of the first fluid.*

*49. The clamp of claim 48, wherein the at least one second channel comprises a plurality of second channels.*

*50. The clamp of claim 45, wherein the first layer and the second layer are optically coupled to each other at a first interface, and the second layer and the third layer are optically coupled to each other at a second interface.*

* * * * *